United States Patent [19]
Tomishima et al.

[11] Patent Number: 5,390,140
[45] Date of Patent: Feb. 14, 1995

[54] SIGNAL OUTPUT CIRCUIT OPERATING STABLY AND ARRANGEMENT OF POWER SUPPLY INTERCONNECTION LINE THEREFOR IN SEMICONDUCTOR INTEGRATED CIRCUIT DEVICE

[75] Inventors: Shigeki Tomishima; Hideto Hidaka; Masakazu Hirose; Takahiro Tsuruda, all of Hyogo, Japan

[73] Assignee: Mitsubishi Denki Kabushiki Kaisha, Tokyo, Japan

[21] Appl. No.: 121,853

[22] Filed: Sep. 17, 1993

[30] Foreign Application Priority Data

Oct. 29, 1992 [JP] Japan .................. 4-291136

[51] Int. Cl.$^6$ .................. G11C 5/06; G11C 5/14
[52] U.S. Cl. ................. 365/51; 365/63; 365/195; 365/226; 365/228
[58] Field of Search .................. 365/51, 226, 228, 194, 365/63

[56] References Cited

U.S. PATENT DOCUMENTS 5,161,124  11/1992  Love .................. 365/51 X
5,319,253   6/1994  You  .................. 365/194 X
5,321,658   6/1994  Ishimura et al. ...... 365/226 X Primary Examiner—Do Hyun Yoo
Attorney, Agent, or Firm—Lowe, Price, LeBlanc & Becker

[57] ABSTRACT

A semiconductor integrated circuit device includes a pad receiving a power supply potential and a pad receiving a ground potential both formed on a chip, and a power supply potential line and a ground potential line connected to respective pads and formed in a loop manner along a circumference of the chip. The semiconductor integrated circuit device includes a first data output circuit provided for a data output terminal proximate to a predetermined potential pad, and a second data output circuit provided for a data output terminal distant from the predetermined potential pad. First and second data output circuits drive corresponding data output terminals to the predetermined potential in two steps at a lower rate and a higher rate in accordance with an internal output data signal. First and second data output circuits include components for compensating for and canceling an influence on driving the corresponding output nodes due to the difference of distances to the predetermined pad therefrom. As a result, data is provided at a high speed and without overshoot, undershoot or ringing.

17 Claims, 18 Drawing Sheets

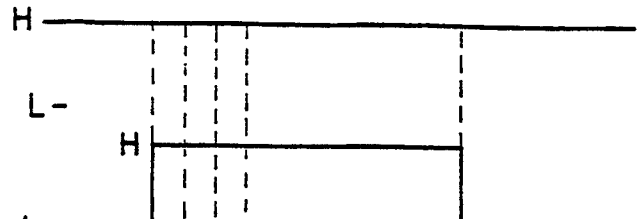
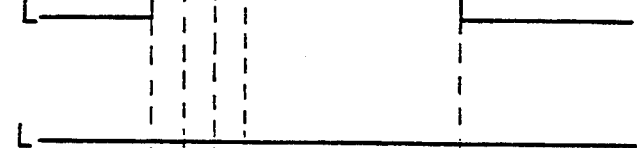
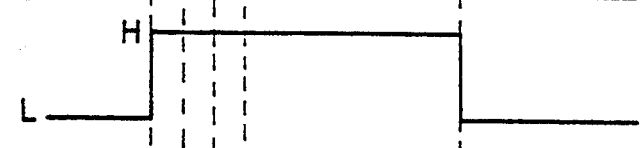
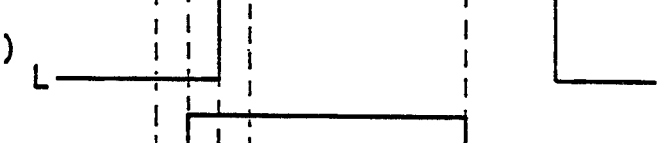
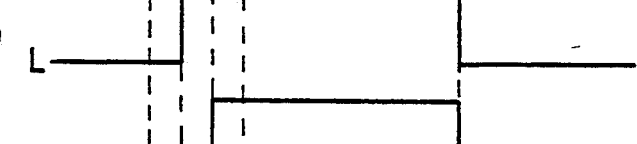
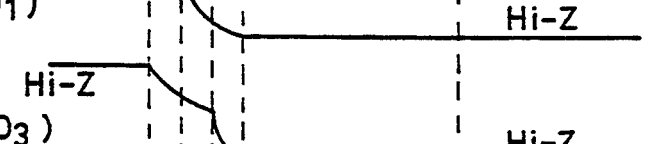
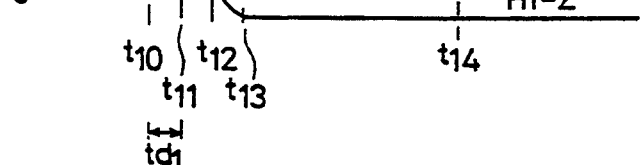

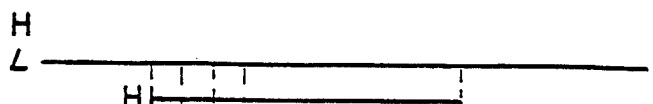
FIG. 5(a) ZDD
FIG. 5(b) OEM
FIG. 5(c) $\phi_1$
FIG. 5(d) $\phi_2$
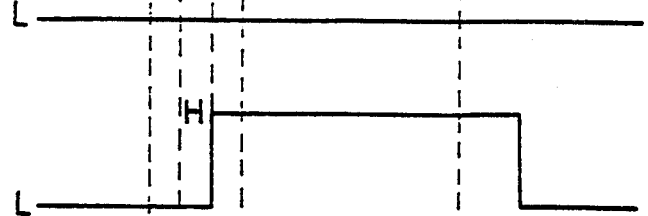
FIG. 5(e) $\phi_5$ (130b)
FIG. 5(f) $\phi_5$ (130a)
FIG. 5(g) $\phi_6$ (130b)
FIG. 5(h) $\phi_6$ (130a)
FIG. 5(i) Dout($D_0,D_1$)
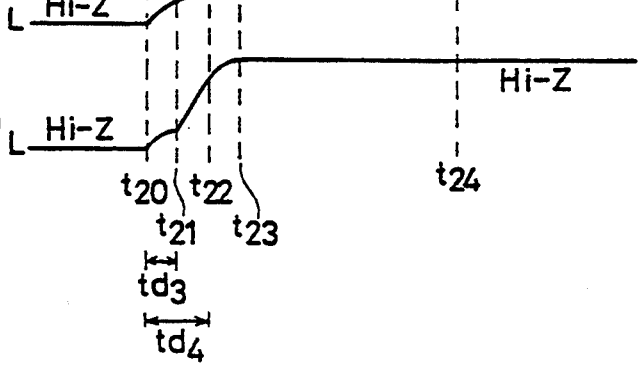
FIG. 5(j) Dout($D_2,D_3$)

FIG. 7(a) ZDD
FIG. 7(b) OEM
FIG. 7(c) φ₁
FIG. 7(d) φ₂
FIG. 7(e) φ₃
FIG. 7(f) φ₄
FIG. 7(g) φ₅ (130b)
FIG. 7(h) φ₅ (130a)
FIG. 7(i) φ₆ (130b)
FIG. 7(j) φ₆ (130a)
FIG. 7(k) Dout (130b)
FIG. 7(m) Dout (130a)
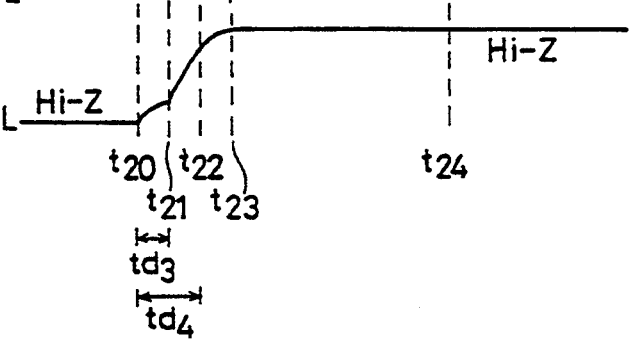

TRANSISTOR SIZE IS DIFFERENT

TRANSISTOR SIZES ARE DIFFERENT

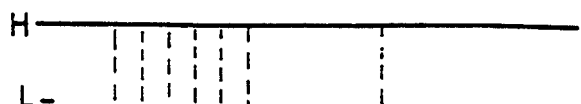
FIG. 9(a) ZDD
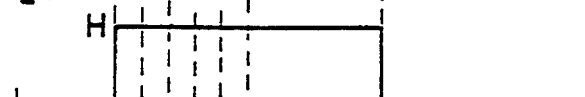
FIG. 9(b) OEM
FIG. 9(c) $\phi_1$
FIG. 9(d) $\phi_2$
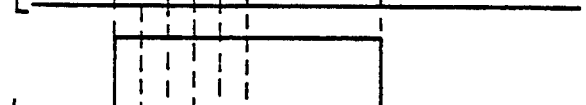
FIG. 9(e) $\phi_3$ (140b)
FIG. 9(f) $\phi_3$ (140a)
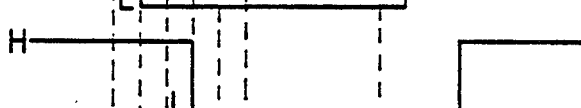
FIG. 9(g) $\phi_4$ (140b)
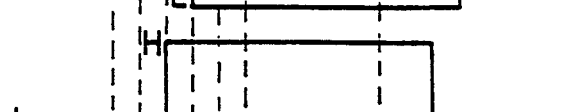
FIG. 9(h) $\phi_4$ (140a)
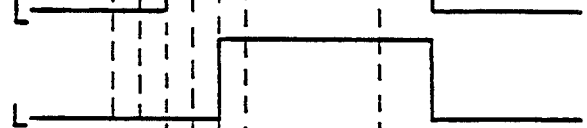
FIG. 9(i) $\phi_5$ (140b)
FIG. 9(j) $\phi_5$ (140b)
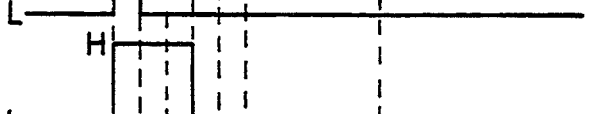
FIG. 9(k) $\phi_6$ (140a)
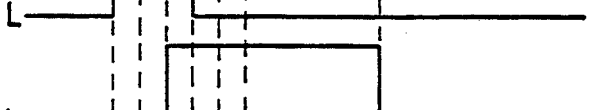
FIG. 9(m) $\phi_6$ (140b)
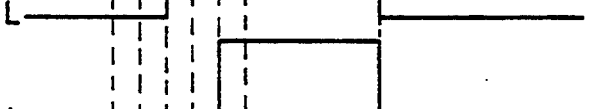
FIG. 9(n) Dout($D_0$, $D_1$)
FIG. 9(p) Dout($D_2$, $D_3$)
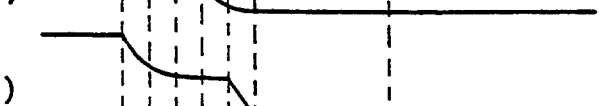

Sa < Sb , & La < Lb

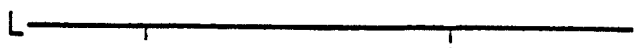
FIG. 20(a) ZDD
FIG. 20(b) OEM
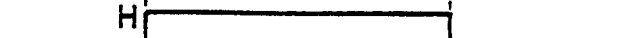
FIG. 20(c) φ₁
FIG. 20(d) φ₂
FIG. 20(e) φ₃
FIG. 20(f) φ₄
FIG. 20(g) Dout
FIG. 21(a) ZDD
FIG. 21(b) OEM
FIG. 21(c) φ₁
FIG. 21(d) φ₂
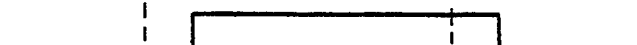
FIG. 21(e) φ₃
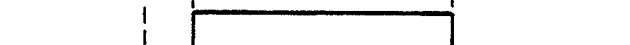
FIG. 21(f) φ₄
FIG. 21(g) Dout

SIGNAL OUTPUT CIRCUIT OPERATING STABLY AND ARRANGEMENT OF POWER SUPPLY INTERCONNECTION LINE THEREFOR IN SEMICONDUCTOR INTEGRATED CIRCUIT DEVICE

BACKGROUND OF THE INVENTION

1. Field of the Invention

The present invention relates to a configuration of a data output portion of a semiconductor integrated circuit device, and more particularly, to a configuration of a data output circuit and an arrangement of power supply interconnection lines therefor in a semiconductor memory device.

2. Description of the Background Art

FIG. 18 schematically shows a chip layout of a general 4M bit DRAM (Dynamic Random Access Memory). Referring to FIG. 18, memory cell groups 2a, 2b are disposed inside a semiconductor chip 1. Memory cell groups 2a, 2b include, although not clearly shown, a plurality of dynamic type memory cells disposed in rows and columns.

At a circumferential end of semiconductor chip 1 (right upper end portion of the chip in FIG. 18), provided is a ground potential pad 3 receiving a ground potential GND. To ground potential pad 3 connected is a ground line 4 transmitting the ground potential, which is formed of a low resistance conductor such as aluminum, and which is disposed in a loop manner along a circumference of semiconductor chip 1.

Along the circumference of semiconductor chip 1, data output portions 5a, 5b, 5c and 5d are disposed for providing data of a memory cell selected from memory cell groups 2a, 2b. In FIG. 18, it is shown that each of data output portions 5a to 5d includes a data output pad and a data output circuit. Data output portions 5a to 5d are supplied with the ground potential from ground line 4, so that, in accordance with applied memory cell data, a corresponding data output node is discharged to the ground potential.

When the data output circuit is operated at a high speed for a high speed operation of the DRAM, undershoot and/or ringing occurs at the data output node, which in turn makes an access time longer (time required for stability of the output data becomes longer). Therefore, various configurations for preventing occurrence of such undershoot and/or ringing without impairing a high speed operation performance have been invented.

FIG. 19 shows a possible configuration of a data output portion for preventing the undershoot/overshoot problem as described above. Since data output portions 5a to 5d have the same configuration, data output portion 5 is representatively shown in FIG. 19.

Data output portion 5 includes a data output circuit 13, a pad 14 for transmitting output data Dout of data output circuit 13 outside, and a pin terminal 15. Data output circuit 13 operates using a power supply potential Vcc applied to a power supply potential node 11 and a ground potential GND applied to a ground potential node 12 as an operation power source. Data output circuit 13 is activated in response to an output enable signal OEM to provide the output data Dout of the same logic level as that of an inversion signal ZDD of data read from a selected memory cell through pad 14 and pin terminal 15.

Data output circuit 13 includes an inverter 13a receiving the data inversion signal ZDD, a 2-input AND circuit 13b providing a signal $\phi 1$ upon receiving the output of inverter 13a and the output enable signal OEM, and an n channel MOS transistor 13c receiving the output $\phi 1$ of AND circuit 13b at its gate. A MOS transistor 13c is rendered conductive when the signal $\phi 1$ is at a logic high or "H" level to be supplied with a current from power supply potential node 11 to charge an output node 13d to a level of the power supply potential Vcc (more exactly Vcc-Vth, where Vth represents a threshold voltage of transistor 13c).

Data output circuit 13 further includes an AND circuit 13e providing a signal $\phi 2$ upon receiving the output enable signal OEM and the data inversion signal ZDD, a delay circuit 13g delaying the output $\phi 2$ of AND circuit 13e by a predetermined time, and a 2-input AND circuit 13h providing a signal $\phi 4$ upon receiving the output $\phi 2$ of AND circuit 13e and an output $\phi 3$ of delay circuit 13g. Delay circuit 13g includes, for example, an even number of cascaded inverters (four inverters in FIG. 19).

Data output circuit 13 further includes an n channel MOS transistor 13f discharging the output node 13d to a potential level of ground potential node 12 in response to the output $\phi 2$ of AND circuit 13e, and an n channel MOS transistor 13i discharging output node 13d to a potential level of ground potential node 12 in response to the output $\phi 4$ of AND circuit 13h. MOS transistor 13i has a size and a current driving ability larger than those of MOS transistor 13f. Description will now be given to operations of data output circuit 13 shown in FIG. 19 with reference to FIGS. 20 and 21 which are operating waveform diagrams thereof. FIG. 20 shows operating waveforms when the inversion signal ZDD is at a logic low or "L" level, and FIG. 21 shows operating waveforms when the inversion signal ZDD is at an "H" level.

When data of the selected memory cell is at an "H" level, the inversion signal ZDD of the data is at an "L" level as shown in FIG. 20(a). AND circuit 13e receiving the inversion signal ZDD of an "L" level provides the output signal $\phi 2$ of an "L" level as shown in FIG. 20(d), independent of the level of the output enable signal OEM which is another input. N channel MOS transistor 13f receiving the output signal $\phi 2$ at the gate electrode is rendered non-conductive. AND circuit 13h receiving the output signal $\phi 2$ of an "L" level provides the output signal $\phi 4$ of an "L" level, as shown in FIG. 20(f), to the gate electrode of n channel MOS transistor 13i independent of the level of the delay signal $\phi 3$ from delay circuit 13g, whereby n channel MOS transistor 13i is rendered nonconductive.

Until the output enable signal OEM rises to an "H" level at a time t0 as shown in FIG. 20(b), AND circuit 13b receiving the output enable signal OEM of an "L" level provides the output signal $\phi 1$ of an "L" level, as shown in FIG. 20(c), to render n channel MOS transistor 13c receiving the output signal $\phi 1$ at the gate electrode non-conductive. Since n channel MOS transistors 13f and 13i are non-conductive, the data Dout provided from output node 13d is in a high impedance state.

When the output enable signal OEM rises to an "H" level at the time t0 as shown in FIG. 20(b), AND circuit 13b receiving the output enable signal OEM and an inversion signal of the inversion signal ZDD provides the output signal $\phi 1$ of an "H" level, as shown in FIG. 20(c), to the gate electrode of n channel MOS transistor 13c. Since n channel MOS transistor 13c is rendered conductive, and power supply potential node 11 and output node 13d are electrically connected, the output data Dout attains an "H" level as shown in FIG. 20(g). When the output enable signal OEM then falls from an "H" level to an "L" level at a time t1 as shown in FIG. 20(b), the output data Dout again attains a high impedance state.

On the other hand, when data of the selected memory cell is at an "L" level, the inversion signal ZDD of the data is at an "H" level as shown in FIG. 21(a). AND circuit 13b receiving an inversion signal of the inversion signal ZDD provides the output signal φ1 of an "L" level, as shown in FIG. 21(c), independent of the level of the output enable signal OEM which is another input. n channel MOS transistor 13c receiving the output signal φ1 at the gate electrode is non-conductive. Until the output enable signal OEM rises to an "H" level at the time t0 as shown in FIG. 21(b), AND circuit 13e receiving the output enable signal OEM of an "L" level provides the output signal φ2 of an "L" level as shown in FIG. 21(d), rendering n channel MOS transistor 13f receiving the output signal φ2 at the gate electrode non-conductive. AND circuit 13h receiving the output signal φ2 of an "L" level provides the output signal φ4 of an "L", level, as shown in FIG. 21(f), to the gate electrode of n channel MOS transistor 13i, independent of the level of the delay signal φ3 from delay circuit 13g. Meantime, since n channel MOS transistor 13i is rendered non-conductive, the data Dout provided from output node 13d is in a high impedance state.

When the output enable signal OEM rises to an "H" level at the time t0 as shown in FIG. 21(b), AND circuit 13e receiving the output enable signal OEM and the inversion signal ZDD provides the output signal φ2 of an "H" level, as shown in FIG. 21(d), to the gate electrode of n channel MOS transistor 13f. Since n channel MOS transistor 13f is rendered conductive, and ground potential node 12 and output node 13d are electrically connected, the output data Dout begins to fall slowly as shown in FIG. 21(g).

Delay circuit 13g receiving the output signal φ2 from AND circuit 13e which rises to an "H" level at the time t0 provides the delay signal φ3 which rises to an "H" level at a time t2 delayed by a delay time td, as shown in FIG. 21(e), which is determined by the number of inverters configuring delay circuit 13g. AND circuit 13h receiving the delay signal φ3 and output signal φ2 from AND circuit 13e of an "H" level provides the output signal φ4 which rises to an "H" level, as shown in FIG. 21(f), to the gate electrode of n channel MOS transistor 13i. Since n channel MOS transistor 13i is rendered conductive, and ground potential node 12 and output node 13d are electrically connected, the output data Dout quickly attains the ground potential as shown in FIG. 21(g). When the output enable signal OEM then falls from an "H" level to an "L" level at a time t3 as shown in FIG. 21(b), the output data Dout again attains a high impedance state.

Undershoot and ringing are prevented from occurring at the time of discharge of output node 13d by delaying the timing to bring the output data Dout of output node 13d into the ground potential in two steps. The falling time of the output data Dout has its lower limit determined by specification. The output data Dout from data output portion 5d proximate to ground potential pad 3 quickly falls to the ground potential through n channel MOS transistor 13i, not only because the potential of power supply interconnection line 4 transmitting the ground potential does not rise from the ground potential GND in the vicinity of data output portion 5d, but also because an interconnection resistance from ground potential pad 3 is small. Therefore, in order to satisfy the lower limit of the specification, delay by delay circuit 13g becomes necessary.

As a conventional semiconductor memory device is made larger in storage capacity with the size of a chip increased, power supply interconnection line 4 transmitting the ground potential becomes longer, causing an interconnection resistance R1 and a parasitic capacitance C1 to increase as shown in FIG. 22. As a result, the longer the distance from ground potential pad 3 to which ground line 4 is connected, the less stable the ground potential which ground potential pad 3 transmits, whereby discharge of a data pin 15 distant from ground potential pad 3 to the ground potential through data output circuit 13 is made slow. Since data output circuit 13 provided in data output portions 5a to 5d has the same configuration independent of the distance from ground potential pad 3, an access speed is determined by the falling time to the ground potential of data pin 15 the most distant from ground potential pad 3 in a multi-bit configuration having a plurality of data output pins as shown in FIG. 18. Therefore, when ground line 4 transmitting the ground potential becomes longer and the ground potential becomes unstable, the access speed is decreased.

In order to shorten the falling time to the ground potential through data output circuit 13 distant from ground potential pad 3, it is considered that a delay time determined by delay circuit 13g in data output circuit 13 is shortened. However, in this case, since data output circuit 13 has the same configuration independent of the distance from ground potential pad 3, the delay time by delay circuit 13g of data output circuit 13 proximate to ground potential pad 3 is also shortened. There is a problem that the output data Dout from data output circuit 13 quickly falls to the ground potential, whereby undershoot and ringing are likely to occur.

The interconnection resistance, the parasitic capacitance and the parasitic inductance of ground line 4 are problematic in a power supply line transmitting the power supply potential Vcc. As shown in FIG. 23, a power supply line 7 transmitting the power supply potential Vcc along a circumference of semiconductor chip 1 is provided in a loop manner. Power supply line 7 is provided at a circumferential end of semiconductor chip 1 to be connected to a power supply pad 6. Data output portions 5a to 5d are supplied with the power supply potential Vcc through power supply line 7 to carry out charge of output node 13d. In order to prevent overshoot and/or ringing at output node 13d (an output band and data output pin) at the time of charge of output node 13d, it is considered that charging operation is carried out in two steps in data output circuit 13.

Referring to FIG. 24, data output circuit 13 includes an inverter 13a receiving the data inversion signal ZDD, a 2-input AND circuit 13b receiving the output enable signal OEM and the output of inverter 13a, a 2-input AND circuit 13e receiving the output enable signal OEM and the data inversion signal ZDD, an n channel MOS transistor 13c charging output node 13d to a level of the power supply potential in response to an output of AND circuit 13b, and an n channel MOS transistor 13h discharging output node 13d to a level of the ground potential in response to an output of AND circuit 13e.

Data output circuit 13 further includes a delay circuit 13k delaying an output of AND circuit 13b by a predetermined time, a 2-input AND circuit 13l receiving an output of delay circuit 13k and an output of AND circuit 13b, and an n channel MOS transistor 13m charging output node 13d to a level of power supply potential in response to an output of AND circuit 13l.

MOS transistor 13m has a size and a current driving ability larger than those of MOS transistor 13c.

In the configuration shown in FIG. 24, when the output of AND circuit 13b rises, MOS transistor 13c is rendered conductive, causing output node 13d to be charged. After a predetermined time, the output of the delay circuit rises, and MOS transistor 13m is rendered conductive, causing output node 13d to be charged. Since output node 13d is charged in two steps, occurrence of overshoot and/or ringing can be prevented.

As for power supply line 7, distributed resistance and parasitic capacitance exist, as shown in FIG. 25. The interconnection resistance and the parasitic capacitance are, shown in FIG. 25 as a resistance R2 and a capacitance C2, respectively, connected between a power supply potential node 11 to which MOS transistors 13c and 13m are connected and a pad 6. The magnitude of resistance R2 and capacitance C2 is in proportion to the distance between pad 6 and data output circuit 13. As a result, data output circuit 13 has a charging time in accordance with the position thereof on semiconductor chip 1. A timing at which the output data Dout is decided is determined by the worst (longest) charging time (which is applied by a data output circuit the most distant from pad 6), causing the access time to be longer. A delay circuit is provided with a data output circuit proximate to pad 6. This is because the conditions of the specification which determines the lower limit of the rising time of the output data Dout are satisfied. Therefore, in the case where all data output circuits have the same configuration, there is a trade off between shortening of the access time and prevention of occurrence of overshoot/ringing.

SUMMARY OF THE INVENTION

One object of the present invention is to provide a semiconductor integrated circuit device including a data output circuit providing output data at a high speed and in a stable manner, independent of the distance from a ground potential pad/power supply potential pad.

Another object of the present invention is to provide an arrangement of power supply interconnection line which can feed a power supply potential/ground potential stably.

In briefly, the semiconductor integrated circuit device according to the present invention includes a component adjusting a charging/discharging rate of an output node of a data output portion in accordance with the distance from the ground potential pad/power supply potential pad.

In the arrangement of the power supply line according to the present invention, the power supply line is divided into plural, each being used for a specific functional circuit. The power supply line is formed in a loop manner, with a portion open-circuited.

In the present invention, when the data output portion distant from a pad to which a predetermined potential is applied provides the predetermined potential, charging/discharging is carried out at a rate corresponding to the distance. Therefore, the potential of a data pin quickly attains the predetermined potential without overshoot/undershoot/ringing.

By reducing a current driving ability of a switching element in the data output circuit proximate to the pad to which the predetermined potential is applied, or by increasing the resistance of the power supply interconnection line from the pad to the data output circuit, the potential of the data pin slowly attains the predetermined potential, whereby overshoot, undershoot and ringing can be prevented.

By including a plurality of power supply interconnection lines connected through pads, and by connecting circuits having different usages such as a sense amplifier, a peripheral logic circuit and a data output circuit by respective power supply interconnection lines, it is possible to reduce parasitic capacitance per power supply interconnection line, whereby a stable predetermined potential can be supplied.

In the case where the power supply interconnection line is not in a complete closed loop, inductance of the power supply interconnection line can be reduced to decrease the influence of magnetic flux penetrating a semiconductor chip, whereby a stable predetermined potential can be supplied.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 3 is a signal waveform diagram showing operations of the circuit shown in FIGS. 2A and 2B.

FIG. 5 is a signal waveform diagram showing operations of the circuit shown in FIGS. 4A and 4B.

FIG. 7 is a signal waveform diagram showing operations of the circuit shown in FIGS. 6A and 6B.

FIG. 9 is a signal waveform diagram showing operations of the circuit shown in FIGS. 8A and 8B.

FIGS. 20 and 21 are signal waveform diagrams showing operations of the circuit shown in FIG. 19.

DESCRIPTION OF THE PREFERRED EMBODIMENTS

(i) First Embodiment

Figure 1:
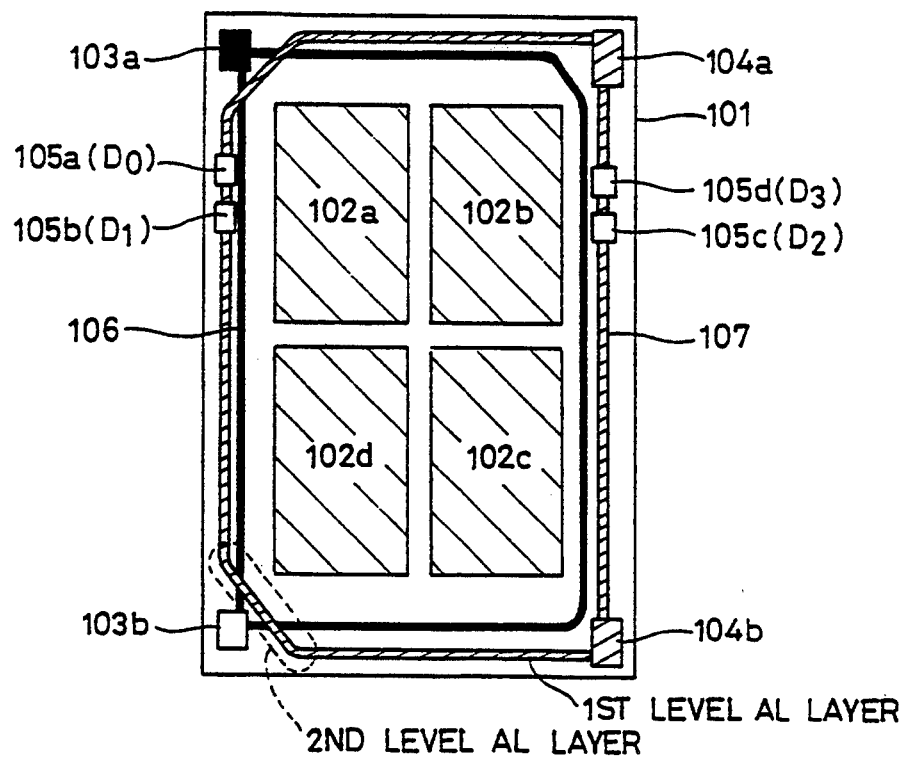
FIG. 1 shows a chip layout of the semiconductor integrated circuit device according to the present invention.

FIG. 1 is a diagram schematically showing the chip layout of the semiconductor integrated circuit device according to the present invention. The semiconductor integrated circuit device shown in FIG. 1, which is a 16M bit DRAM, includes four memory cell groups 102a to 102d. A power supply potential pad 103 (103a, 103b) receiving the power supply potential Vcc is disposed at the upper and lower ends of one side of a semiconductor chip 101. A ground potential pad 104 (104a, 104b) receiving the ground potential GND is disposed at the upper and lower ends of the other side of semiconductor chip 101.

Connected to power supply potential pad 103 is a power supply interconnection line 106, which is formed of a low resistance conductor such as aluminum along a circumference of semiconductor chip 101 in a loop manner. Connected to ground potential pad 104 is a ground potential line 107, which is formed of a low resistance conductor such as aluminum along the circumference of semiconductor chip 101 in a loop manner. A cross-over portion of power supply interconnection line 106 and ground potential line 107 is made in a multi-layered structure. More specifically, ground potential line 107 uses a second level aluminum layer of an upper layer at the cross-over portion shown by a dotted line in FIG. 1, and uses a first level aluminum layer of a lower layer at the portions other than the cross-over portions.

Data output portions 105a, 105b, 105c and 105d for providing data of a selected memory cell are disposed on both sides of semiconductor chip 101. Data output portions 105a to 105d are supplied with the power supply potential and the ground potential through proximate power supply interconnection line 106 and ground potential line 107, to carry out charging/discharging of an output terminal of corresponding data. Data output portions 105a, 105b are disposed on one side of semiconductor chip 101 where power supply potential pad 103 is provided, while data output portions 105c, 105d are disposed on the other side of semiconductor chip 101 where ground potential pad 104 is provided.

Figure 2A:
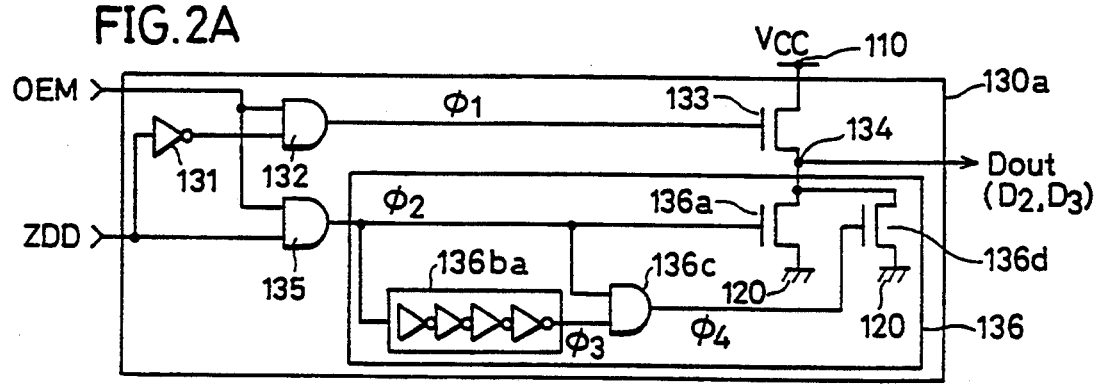
FIGS. 2A and 2B show a configuration of a data output circuit which is a first embodiment of the present invention.
Figure 2B:
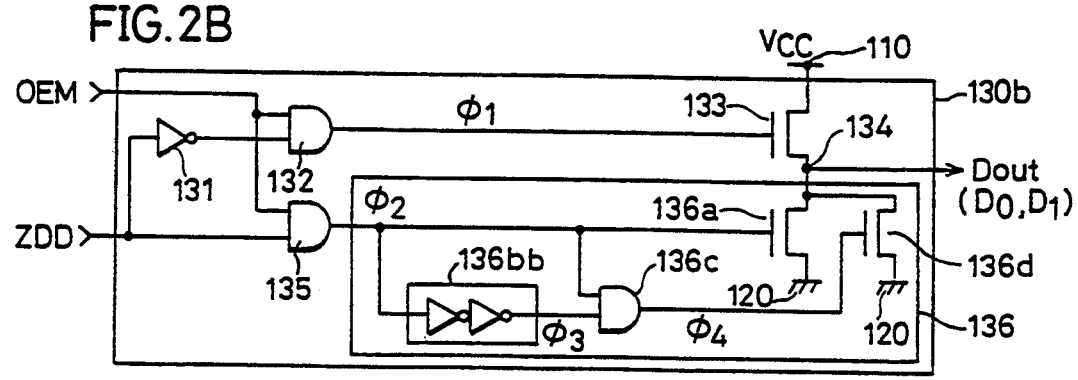

FIG. 2A shows a data output circuit 130a which is included in data output portions 105c, 105d proximate to ground potential pad 104a, and FIG. 2B shows a data output circuit 130b which is included in data output portions 105a, 105b proximate to power supply potential pad 103a.

Referring to FIG. 2A, data output circuit 130a includes an inverter 131 receiving an inversion signal ZDD of data read from a selected memory cell, a 2-input AND circuit 132 receiving an output enable signal OEM and the output of inverter 131, a 2-input AND circuit 135 receiving the inversion signal ZDD and the output enable signal OEM, and an n channel MOS transistor 133 electrically connecting a power supply node 110 and an output node 134 in response to an output $\phi 1$ of AND circuit 132. MOS transistor 133 is turned on when the output $\phi 1$ of AND circuit 132 is at an "H" level to charge output node 134 to a level of the power supply potential Vcc.

Data output circuit 130a further includes a delay circuit 136ba delaying the output $\phi 2$ of AND circuit 135 by a predetermined time, and a 2-input AND circuit 136c receiving the output $\phi 2$ of AND circuit 135 and the output $\phi 3$ of delay circuit 136ba. Delay circuit 136ba, including an even number of cascaded inverters (four inverters in FIG. 2A), provides the output $\phi 2$ of AND circuit 135 with a delay time td2.

Data output circuit 130a further includes an n channel MOS transistor 136a discharging output node 134 to the potential level of ground potential node 120 in response to the output $\phi 2$ of AND circuit 135, and an n channel MOS transistor 136d discharging output node 134 to the potential level of ground potential node 120 in response to the output $\phi 4$ of AND circuit 136c. MOS transistor 136d has a size and a current driving ability larger than those of MOS transistor 136a.

Output node 134 is connected to a data output terminal through a data pad. Power supply potential node 110 and ground potential node 120 are connected to proximate power supply interconnection line 106 and ground potential line 107, respectively. Transistor 133 charges output node 134, and a circuit block 136 discharges output node 134.

Referring to FIG. 2B, a data output circuit 130b has a configuration similar to that of data output circuit 130a shown in FIG. 2A. However, a delay time td1 which is provided by a delay circuit 136bb inside data output circuit 130b to the output $\phi 2$ of AND circuit 135 is shorter than a delay time td2 of a delay circuit 136ba inside data output circuit 130a. Adjustment of the delay time is implemented by an appropriate selection of the number of inverters in delay circuits 136ba, 136bb.

Data output circuits 130a, 130b both are supplied with the power supply potential and the ground potential from nodes 110, 120, and activated in response to the output enable signal to provide a signal of the same logic level as that of the data inversion signal ZDD to a corresponding data output terminal. Description will now be given to operations of the circuits of FIGS. 2A and 2B with reference to FIG. 3, which is an operating waveform diagram. In FIG. 3, operating waveforms are shown when the data inversion signal ZDD is at an "H" level.

First, it is assumed that data read from four selected memory cells is all at an "L" level. The inversion signal ZDD of data applied to data output circuit 130 provided in data output portions 105a to 105d and read from the memory cell is all at an "H" level as shown in FIG. 3(a). Since inverter 131 receiving the inversion signal ZDD provides a signal of an "L" level to AND circuit 132, AND circuit 132 provides the signal $\phi 1$ of an "L" level as shown in FIG. 3(c), independent of the level of the output enable signal OEM, whereby n channel MOS transistor 133 receiving the output signal $\phi 1$ at the gate electrode is rendered non-conductive.

Until the output enable signal OEM rises to an "H" level at a time t10 as shown in FIG. 3(b), AND circuit 135 receiving the output enable signal OEM of an "L" level provides the output signal ¢2 of an "L" level as shown in FIG. 3(d). An n channel MOS transistor 136a receiving the output signal $\phi 2$ at the gate electrode is rendered non-conductive. An AND circuit 136c receiving the output signal $\phi 2$ of an "L" level provides the output signal $\phi 4$ of an "L" level to the gate electrode of an n channel MOS transistor 136d as shown in FIG. 3(g) and FIG. 3(h). Since n channel MOS transistor 136d is rendered non-conductive, the data Dout (D0 to D3) provided from output node 134 is in a high impedance state as shown in FIG. 3(i) and FIG. 3(j).

When the output enable signal OEM rises to an "H" level at the time t10 as shown in FIG. 3(b), AND circuit 135 receiving the output enable signal OEM and the inversion signal ZDD provides the signal $\phi 2$ which rises to an "H" level as shown in FIG. 3(d) to the gate electrode of n channel MOS transistor 136a. n channel MOS transistor 136a is rendered conductive, and ground potential node 120 and output node 134 are electrically connected, whereby the output data Dout begins to fall slowly as shown in FIG. 3(i) and FIG. 3(j).

A delay circuit 136bb is provided at data output circuit 130b of data output portions 105a and 105b distant from ground potential pad 104 shown in FIG. 2. Delay circuit 136bb receives the output signal $\phi 2$ from AND circuit 135 which rises to an "H" level at the time t10. Delay circuit 136bb provides the delay signal $\phi 3$ which rises to an "H" level at a time t11 delayed by a delay time td1 as shown in FIG. 3(e). AND circuit 136c receiving the delay signal $\phi 3$ and the output signal $\phi 2$ of an "H" level from AND circuit 135 provides the output signal $\phi 4$ which rises to an "H" level, as shown in FIG. 3(g), to the gate electrode of n channel MOS transistor 136d. Since n channel MOS transistor 136d is rendered conductive, and ground potential node 120 and output node 134 are electrically connected, the output data Dout (D0, D1) quick falls, as shown in FIG. 3(i), to attain the ground potential at the time t13.

On the other hand, in data output circuit 130a, delay circuit 136ba receiving the output signal $\phi 2$ from AND circuit 135 which rises to an "H" level at the time t10 provides the delay signal $\phi 3$. The delay signal $\phi 3$ rises to an "H" level at a time t12 delayed by a delay time td2 which is longer than the delay time td1 as shown in FIG. 3(f). AND circuit 136c receiving the delay signal $\phi 3$ and the output signal $\phi 2$ of an "H" level from AND circuit 135 provides the output signal $\phi 4$ which rises to an "H" level, as shown in FIG. 3(h), to the gate electrode of n channel MOS transistor 136d. n channel MOS transistor 136d is rendered conductive, and ground potential node 120 and output node 134 are electrically connected. As shown in FIG. 3(j), the falling rate of the output data Dout (D2, D3) is faster than the falling rate at which the output data Dout (D0, D1) (which is provided from data output portions 105a and 105b distant from ground potential pad 104 shown in FIG. 3(i)) attains the ground potential from a time t11 to a time t13. The output data Dout (D2, D3) attains the ground potential at the time t13.

Then, when the output enable signal OEM falls from an "H" level to an "L" level at a time t14 as shown in FIG. 3(b), AND circuit 135 receiving the output enable signal OEM provides the signal $\phi 2$ of an "L" level to the gate electrode of n channel MOS transistor 136a as shown in FIG. 3(d). On the other hand, AND circuit 136c receiving the output signal $\phi 2$ of an "L" level provides the signal $\phi 4$ of an "L" level to the gate electrode of n channel MOS transistor 136d as shown in FIG. 3(g) and FIG. 3(h). n channel MOS transistors 136a and 136d are rendered non-conductive, whereby the output data Dout (D0 to D3) again attains a high impedance state.

In the first embodiment of the present invention, the falling time of the output data Dout (D0, D1) from data output circuit 130b positioned distant from ground potential pad 104 is shortened to be equal to the falling time of the output data Dout from data output circuit 130a positioned proximate to ground potential pad 104. Therefore, the falling time of data output circuit 130b positioned distant from ground pad 104 is shortened more as compared to a conventional one, and the access time is reduced.

(ii) Second Embodiment

Figure 4A:
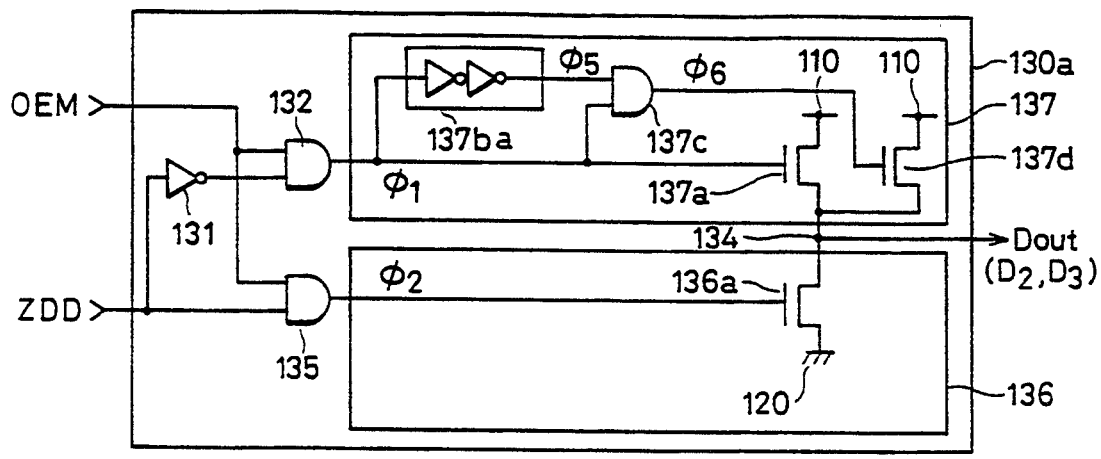
FIGS. 4A and 4B show a configuration of a data output circuit which is a second embodiment of the present invention.
Figure 4B:
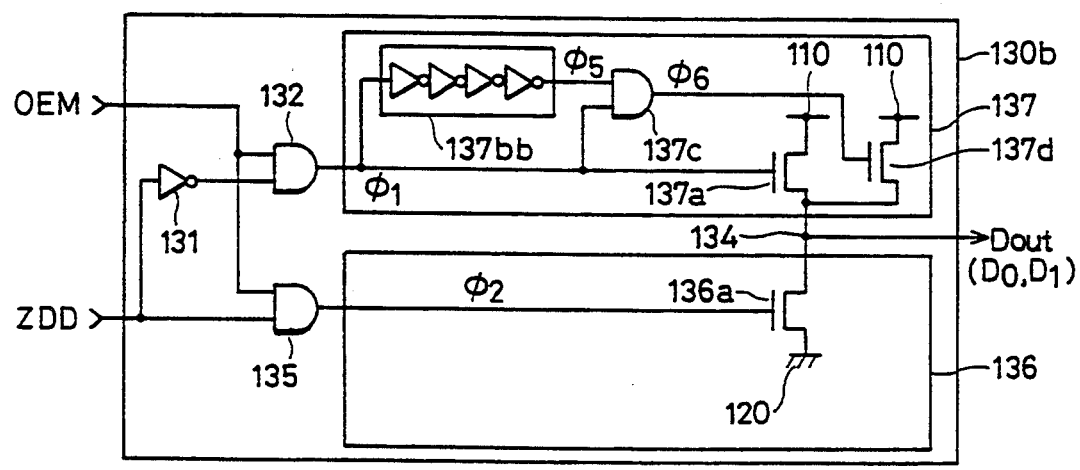

FIGS. 4A and 4B show a configuration of a data output circuit of the second embodiment of the present invention. The configuration of the second embodiment prevents overshoot/ringing of the output data Dout caused by power supply interconnection line 106, and shortens the access time. FIG. 4A show a configuration of data output circuit 130a proximate to ground potential pad 104a that is, distant from power supply potential pad 103. FIG. 4B shows a configuration of data output circuit 130b distant from ground potential pad 104, that is, proximate to power supply potential pad 103.

Referring to FIG. 4A, data output circuit 130a includes inverter 131 inverting the data inversion signal ZDD, 2-input AND circuit 132 receiving the output enable signal OEM and the output of inverter 131, 2-input AND circuit 135 receiving the output enable signal OEM and the data inversion signal ZDD, an n channel MOS transistor 137a electrically connecting output node 134 and power supply potential node 110 in response to the output $\phi 1$ of AND circuit 132, and an n channel MOS transistor 136a electrically connecting output node 134 and ground potential node 120 in response to the output $\phi 2$ of AND circuit 135. MOS transistors 136a and 137a are rendered conductive when the output $\phi 2$ of AND circuit 135 and the output $\phi 1$ of AND circuit 132 are in an "H" level, respectively.

Data output circuit 130a further includes a delay circuit 137ba delaying the output $\phi 1$ of AND circuit 132 by a predetermined time, a 2-input AND circuit 137c receiving an output $\phi 5$ of delay circuit 137ba and the output $\phi 1$ of AND circuit 132, and n channel MOS transistor 137d electrically connecting output node 134 and power supply potential node 110 in response to the output of AND circuit 137c. MOS transistor 137d has a size and a current driving ability larger than those of MOS transistor 137a. Circuit block 136 discharges output node 134 in accordance with memory cell data, and circuit block 137 charges output node 134 in accordance with memory cell data. Data D0, D1 is provided from data output circuit 130a.

Referring to FIG. 4B, data output circuit 130b has a configuration similar to that of data output circuit 130a of FIG. 4A. However, a delay time td3 provided by a delay circuit 137ba inside data output circuit 130a is shorter than a delay time td4 provided by delay circuit 137ba in data output circuit 130b. Adjustment of delay times td3, td4 is implemented by adjusting the number of stages of inverters included in respective delay circuits 137ba and 137bb. In FIGS. 4A and 4B, delay circuit 137ba includes two stages of inverters, and delay circuit 137bb includes four stages of inverters. Operations of data output circuits 130a, 130b shown in FIGS. 4A, 4B will now be described with reference to FIG. 5, which is a operating waveform diagram.

When data read from a selected 4 bit memory cell is all in an "H" level, the inversion signal ZDD of data applied to data output circuits 130a, 130b and read from the memory cell is all in an "L" level as shown in FIG. 5(a). AND circuit 135 in data output circuits 130a, 130b receiving the inversion signal ZDD of an "L" level provides the signal $\phi 2$ of an "L" level, as shown in FIG. 5(d), independent of the level of the output enable signal OEM. n channel MOS transistor 136a receiving the output signal $\phi 2$ at the gate electrode is rendered non-conductive.

Until the output enable signal OEM rises to an "H" level at a time t20 as shown in FIG. 5(b), AND circuit 132 receiving the output enable signal OEM of an "L" level provides the output signal $\phi 1$ of an "L" level as shown in FIG. 5(c). n channel MOS transistor 137a receiving the output signal $\phi 1$ at the gate electrode is rendered non-conductive. AND circuit 137c receiving the output signal $\phi 1$ of an "L" level provides an output signal $\phi 6$ of an "L" level, as shown in FIG. 5(g) and FIG. 5(h), to the gate electrode of n channel MOS transistor 137d, independent of the level of the delay signal $\phi 5$ from delay circuits 137ba, 137bb. Since n channel MOS transistor 137d is rendered non-conductive, the data Dout (D0 to D3) provided from output node 134 is in a high impedance state.

When the output enable signal OEM rises to an "H" level at the time t20 as shown in FIG. 5(b), AND circuit 132 receiving the output enable signal OEM and the inversion signal ZDD provides the signal $\phi 1$ which rises to an "H" level, as shown in FIG. 5(c), to the gate electrode of n channel MOS transistor 137a. n channel MOS transistor 137a is rendered conductive, and power supply potential node 110 and output node 134 are electrically connected, whereby the output data Dout (D0, D1, D2, D3) begins to rise slowly as shown in FIG. 5(i) and FIG. 5(j).

Delay circuit 137ba inside data output circuit 130a providing data D2, D3 provides the delay signal $\phi 5$ which rises to an "H" level at a time t21 delayed from the rise of the signal $\phi 1$ by the delay time td3. AND circuit 137c receiving the delay signal $\phi 5$ and the output signal $\phi 1$ of an "H" level from AND gate 132 provides the output signal $\phi 6$ which rises to an "H" level, as shown in FIG. 5(h), to the gate electrode of n channel MOS transistor 137d. Since n channel MOS transistor 137d is rendered conductive, and power supply node 110 and output node 134 are electrically connected, the output data Dout (D2, D3) quickly rises, as shown in FIG. 5 (j), to attain a level of the power supply potential Vcc at the time t23.

In data output circuit 130b providing the data D0, D1, delay circuit 137b provides the delay signal $\phi 5$ which rises to an "H" level at the time t22 delayed by a delay time td4 which is longer than the delay time td3, as shown in FIG. 5(e). AND circuit 137c receiving the delay signal $\phi 5$ and the output signal $\phi 1$ of an "H" level from AND circuit 132 provides the output signal $\phi 6$ which rises to an "H" level, as shown in FIG. 5(g), to the gate electrode of n channel MOS transistor 137d. As a result, n channel MOS transistor 137d is rendered conductive, and power supply potential node 110 and output node 134 are electrically connected. Therefore, as shown in FIG. 5(i), the rising time of the output data Dout (D0, D1) is faster than the rising time at which the output data Dout (D2, D3) shown in FIG. 5(j) rises to the power supply potential Vcc from the time t21 to the time t23. The output data Dout (D0, D1) attains a level of the power supply potential Vcc at the time t23.

Then, when the output enable signal OEM falls from an "H" level to an "L" level at a time t24 as shown in FIG. 5(b), AND circuit 132 receiving the output enable signal OEM provides the signal $\phi 1$ of an "L" level, as shown in FIG. 5(c), to the gate electrode of n channel MOS transistor 137a. AND circuit 137c receiving the output signal $\phi 1$ of an "L" level provides the signal $\phi 6$ of an "L" level, as shown in FIG. 5(g) and FIG. 5(h), to the gate electrode of n channel MOS transistor 137d. Therefore, n channel MOS transistors 137a and 137d are rendered non-conductive, and the output data Dout (D0 to D3) again attains a high impedance state.

In the second embodiment of the present invention, the rising time of the output data Dout (D2, D3) from data output circuit 130a positioned distant from power supply potential pad 103 is shortened to be equal to the rising time of the output data Dout (D0, D1) from data output circuit 130b positioned proximate to power supply potential pad 103. Therefore, the fact that the rising time of data output circuit 130a positioned proximate to power supply potential pad 103 is long does not decrease the access speed.

Data output circuit 130b proximate to power supply potential pad 103 charges output node 134 through delay circuit 137bb in two steps, preventing occurrence of ringing/overshoot of the output data Dout (D0, D1).

(iii) Third Embodiment

The first embodiment takes only the influence of the ground potential line into consideration, while the second embodiment takes only the influence of the power supply potential line into consideration. It can be examined by simulation and the like the influence of which power supply lines is greater. An appropriate measure may be taken with respect to a power supply line which has a larger influence. In the following description, "power supply line" includes both of "power supply potential line" and "ground potential line".

Figure 6A:
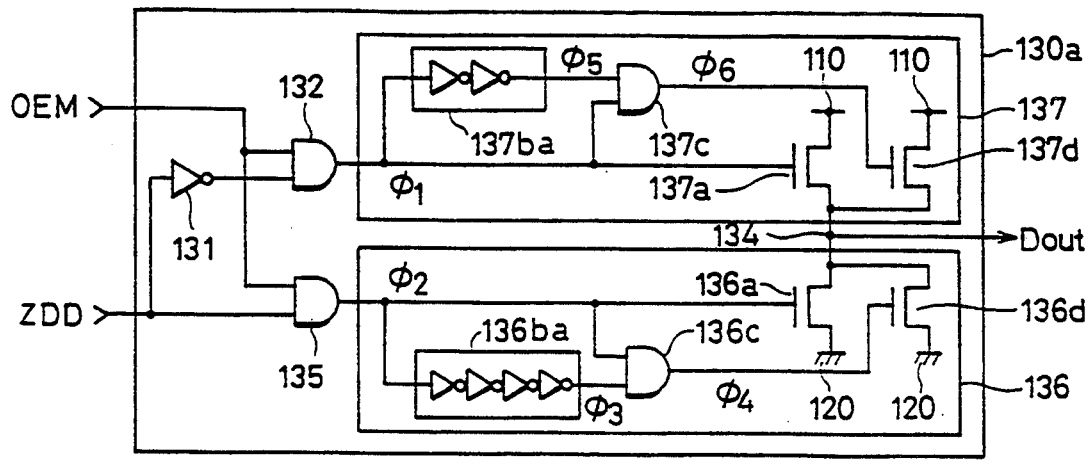
FIGS. 6A and 6B show a configuration of a data output circuit which is a third embodiment of the present invention.
Figure 6B:
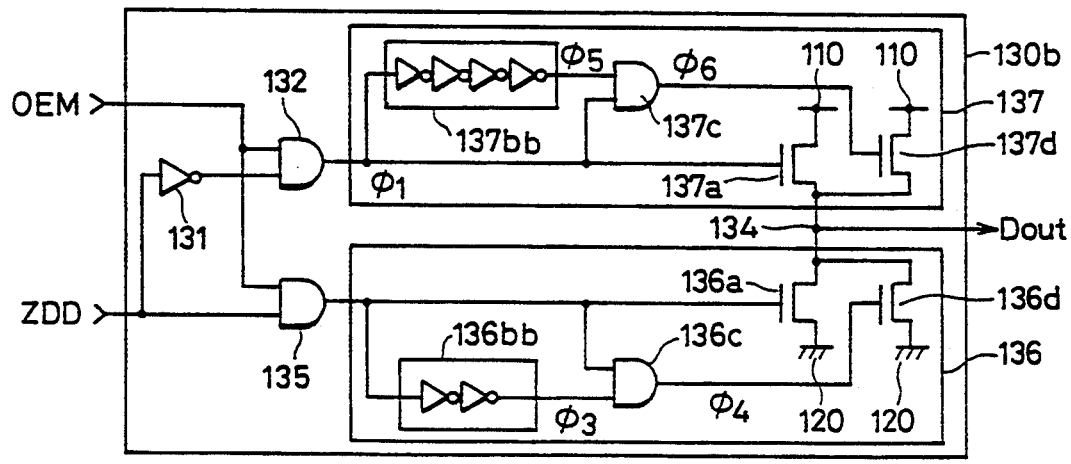

FIGS. 6A and 6B show a configuration of the third embodiment of the present invention. Data output circuits 130a, 130b shown in FIGS. 6A, 6B have a configuration of combination of the first and the second embodiments.

In FIGS. 6A and 6B, the same reference numerals are given to components corresponding to those of data output circuits shown in FIGS. 2A, 2B, 4A and 4B. Therefore, detailed description will not be repeated.

FIG. 7 shows operating waveforms when the data inversion signal ZDD is in an "L" level. The operating waveforms shown in FIG. 7 are substantially the same as those shown in FIG. 5. Since operating waveforms when the data inversion signal ZDD is in an "H" level are substantially the same as those of FIG. 3 (in which signals φ5, φ6 are fixed at an "L" level), the operating waveforms are not shown.

Since operations of circuits of FIGS. 6A and 6B are in combination of operations of the first and the second embodiments, description will not be repeated.

In the case of the configuration shown in FIGS. 6A and 6B, even if the influence of both of the power supply interconnection line (Vcc) and the ground line (GND) is significant, it is possible to generate the output data Dout without occurrence of undershoot/overshoot/ringing, whereby the access time can be shortened.

A configuration taking only the influence of the ground potential line into consideration has been discussed. However, it can be easily modified to the configuration which takes the influence of the power supply interconnection line into consideration and also can be extended to the configuration of combination of both of the ground potential line and the power supply interconnection line. Therefore, application of the present invention to these configurations is not excluded.

(iv) Fourth Embodiment

Figure 8A:
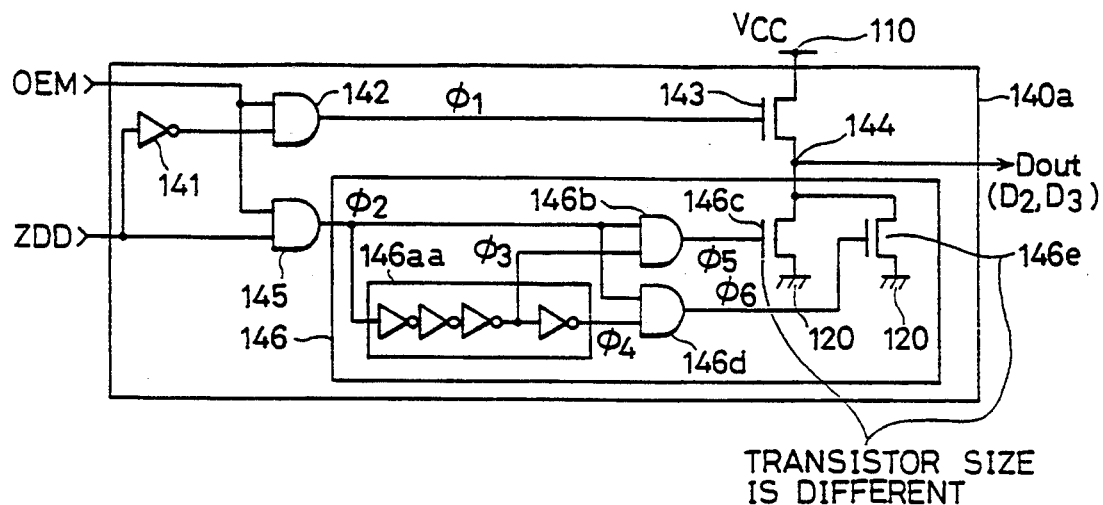
FIGS. 8A and 8B show a configuration of a data output circuit which is a fourth embodiment of the present invention.
Figure 8B:
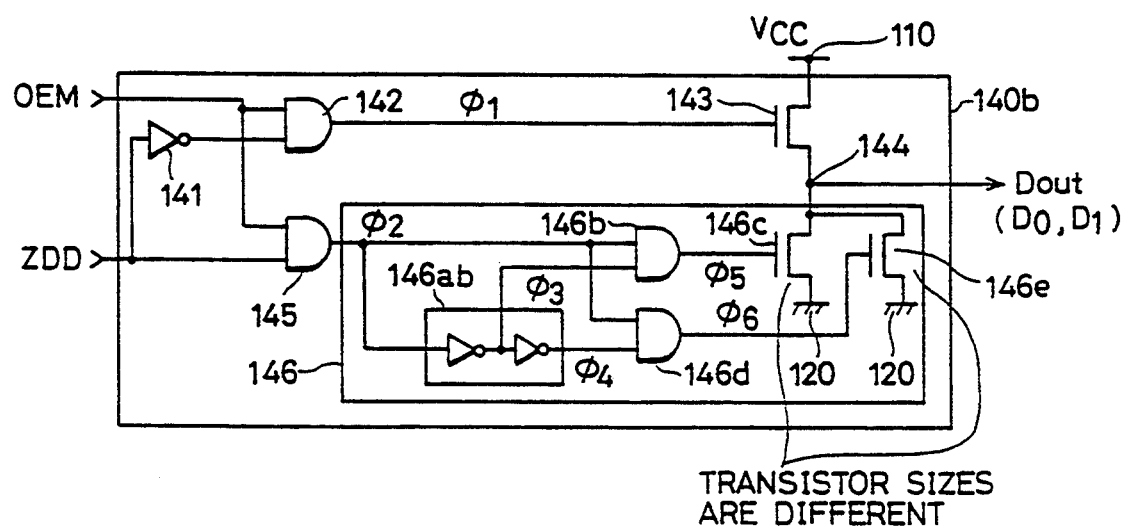

FIGS. 8A and 8B show a configuration of a data output circuit which is the fourth embodiment of the present invention. FIG. 8A shows a data output circuit 140a proximate to ground potential pad 104 for providing data D2, D3. FIG. 8B shows data output circuit 140b distant from ground potential pad 104 for providing data D0, D1.

Referring to FIG. 8A, data output circuit 140a includes an inverter 141 receiving the data inversion signal ZDD, a 2-input AND circuit 142 receiving the output enable signal OEM and the output of inverter 141, an n channel MOS transistor 143 charging an output node 144 to the potential level of power supply potential node 110 in response to the output φ1 of AND circuit 142, a 2-input AND circuit 145 receiving the data inversion signal ZDD and the output enable signal OEM, and a switching circuit 146 discharging an output node 144 to the potential level of ground potential node 120 in response to the output φ2 of AND circuit 145.

Switching circuit 146 includes a delay circuit 146aa delaying the output of AND circuit 145 to generate the delay inversion signal φ3 and the delay signal φ4, a 2-input AND circuit 146bb receiving the delay inversion signal φ3 of delay circuit 146aa and the output φ2 of AND circuit 145, an n channel MOS transistor 146c discharging output node 144 to the potential level of ground potential node 120 in response to the output φ5 of AND circuit 146b, a 2-input AND circuit 146d receiving the delay signal φ4 of delay circuit 146aa and the output φ2 of AND circuit 145, and an n channel MOS transistor 146e discharging output node 144 to the potential level of ground potential node 120 in response to the output φ6 of AND circuit 146d.

Delay circuit 146aa includes four cascaded inverters. The third stage inverter provides the delay inversion signal φ3, and the fourth stage inverter provides the delay signal φ4. More specifically, a delay time of the delay inversion signal φ3 is shorter than that of the delay signal φ4. MOS transistor 146e has a size and a current driving ability larger than those of MOS transistor 146c.

Data output circuit 140b shown in FIG. 8B has the same configuration as that of data output circuit 140a of FIG. 8A. A delay time of delay circuit 146ab inside switching circuit 146 of FIG. 8B is shorter than that of delay circuit 146aa inside data output circuit 140a of FIG. 8A. Delay circuit 146ab includes inverters of two stages. The first stage inverter generates the delay inversion signal φ3, and the second stage inverter generates the delay signal φ4. Therefore, a delay time of the delay signal φ4 of delay circuit 146ab is shorter than that of the delay inversion signal φ3 of delay circuit 146aa.

Operations of the fourth embodiment of the present invention will now be described with reference to a timing diagram of FIG. 9. It is here assumed that data read from four selected memory cells are all in an "L" level and the data are applied to data output circuits 140a, 140b corresponding to the output data D0 through D3. Inversion signals ZDD of data read from these memory cells are all in an "H" level as shown in FIG. 9(a). Inverter 141 receiving the inversion signal ZDD of an "H" level provides a signal of an "L" level to AND circuit 142. AND circuit 142 provides the signal φ1 of an "L" level, as shown in FIG. 9(c), independent of the level of the output enable signal OEM. N channel MOS transistor 143 receiving the output signal φ1 at the gate electrode is rendered non-conductive.

Until the output enable signal OEM rises to an "H" level at a time t30 as shown in FIG. 9(b), AND circuit 145 receiving the output enable signal OEM of an "L" level provides the output signal φ2 of an "L" level as shown in FIG. 9(d). AND circuit 146b receiving the output signal φ2 and the signal φ3 of an "H" level from delay circuits 146aa, 146ab provides the signal φ5 of an "L" level, as shown in FIG. 9(i) and FIG. 9(j). An n channel MOS transistor 146c receiving the output signal φ5 at the gate electrode is rendered non-conductive. AND circuit 146d receiving the output signal φ2 of an "L" level provides the output signal φ6 of an "L" level, as shown in FIG. 9(k) and FIG. 9(m), to the gate electrode of n channel MOS transistor 146e, independent of the level of the delay signal φ4 from delay circuits 146aa, 146ab. Since n channel MOS transistor 146e is rendered non-conductive, the data Dout (D0 to D3) provided from output node 144 is in a high impedance state.

When the output enable signal OEM rises to an "H" level at the time t30, as shown in FIG. 9(b), AND circuit 145 receiving the output enable signal OEM and the inversion signal ZDD provides the signal φ2 which rises to an "H" level as shown in FIG. 9(d). AND circuit 145b receives the signal φ3 which is still at an "H" level, as shown in FIG. 9(e) and FIG. 9(f), due to delay by the output signal φ2 and inverters of delay circuits 146aa, 146ab. AND circuit 146b provides the signal φ5 which rises to an "H" level, as shown in FIG. 9(i) and FIG. 9(j), to the gate electrode of n channel MOS transistor 146c. Since n channel MOS transistor 146c is rendered conductive, and ground potential node 120 and output node 144 are electrically connected, the output data Dout (D0 to D3) begins to fall slowly as shown in FIG. 9(n) and FIG. 9(p).

Delay circuit 140ab is included in data output circuit 140b distant from ground potential pad 104. Delay circuit 140ab receives the output signal φ2 from AND circuit 145 which rises to an "H" level at the time t30. Delay circuit 140ab provides the signal φ3 which falls to an "L" level at a time t31 delayed by a delay time td5, as shown in FIG. 9(e). Since AND circuit 146b receiving the signal φ3 provides the signal φ5 which falls to an "L" level, as shown in FIG. 9(i), to the gate electrode of n channel MOS transistor 146c, n channel MOS transistor 146 is rendered non-conductive. Delay circuit 146ab further provides the delay signal φ4 which rises to an "H" level at a time t32 delayed from the time t30 by a delay time td6, as shown in FIG. 9(g). AND circuit 146d receiving the delay signal φ4 and the output signal φ2 of an "H" level from AND circuit 145 provides the output signal φ6 which rises to an "H" level, as shown in FIG. 9(k), to the gate electrode of n channel MOS transistor 146e. Since n channel MOS transistor 146e is rendered conductive, and ground potential node 120 and output node 144 are electrically connected, the output data Dout (D0, D1) falls quickly, as shown in FIG. 9(n), to attain the ground potential at a time t35.

On the other hand, in data output circuit 140a proximate to ground potential pad 104, delay circuit 146ab receiving the output signal φ2 from AND circuit 145 which rises to an "H" level at the time t30 provides the signal φ3. The signal φ3 falls to an "L" level at a time t33 delayed by a delay time td7 which in turn is longer by the delay in two stages of inverters than the delay time td5 as shown in FIG. 9(f). AND circuit 146b receiving the signal φ3 provides the signal φ5 which falls to an "L" level, as shown in FIG. 9(j), to the gate electrode of n channel MOS transistor 146c, whereby n channel MOS transistor 146c is rendered non-conductive. Delay circuit 146aa further provides the delay signal φ4 which rises to an "H" level at a time t34 delayed from the time t30 by a delay time td8, as shown in FIG. 9(h). AND circuit 146d receiving the delay signal φ4 and the output signal φ2 of an "H" level from AND circuit 145 provides the signal φ6 which rises to an "H" level, as shown in FIG. 9(m), to the gate electrode of n channel MOS transistor 146e, whereby n channel MOS transistor 146e is rendered conductive. Since ground potential node 120 and output node 144 are electrically connected, the falling rate of the output data Dout (D2, D3), as shown in FIG. 9(p), is faster than the falling rate at which the output data Dout (D0, D1) (which is provided from data output portions 105a and 105b distant from ground potential pad 104) attains the ground potential from the time t32 to the time t35, shown in FIG. 9(n). The output data Dout (D2, D3) attains the ground potential at the time t35.

When the output enable signal OEM falls from an "H" level to an "L" level at a time t36, a shown in FIG. 9(b), AND circuit 145 receiving the output enable signal OEM provides the signal φ2 of an "L" level, as shown in FIG. 9(d). AND circuit 146b receiving the output signal φ2 provides the signal φ5 of an "L" level, as shown in FIG. 9(i) and FIG. 9(j), to the gate electrode of n channel MOS transistor 146c. AND circuit 146d receiving the output signal φ2 of an "L" level provides the signal φ6 of an "L" level, as shown in FIG. 9(k) and FIG. 9(m), to the gate electrode of n channel MOS transistor 146e. As a result, n channel MOS transistors 146c and 146e are rendered non-conductive, whereby the output data Dout (D0 to D3) again attains a high impedance state as shown in FIG. 9(n) and FIG. 9(p).

In the fourth embodiment of the present invention, similar to the first embodiment, the falling time of the output data Dout (D0, D1) from data output circuit 140b positioned distant from the ground potential pad 104 is shortened to be equal to the falling time of the output data Dout (D2, D3) from data output circuit 140a positioned proximate to ground potential pad 104. Therefore, the fact that the falling time of data output circuit 140b positioned distant from ground potential pad 104 is long does not decrease the access speed. Overshoot/ringing do not occur.

(v) Fifth Embodiment

Figure 10A:
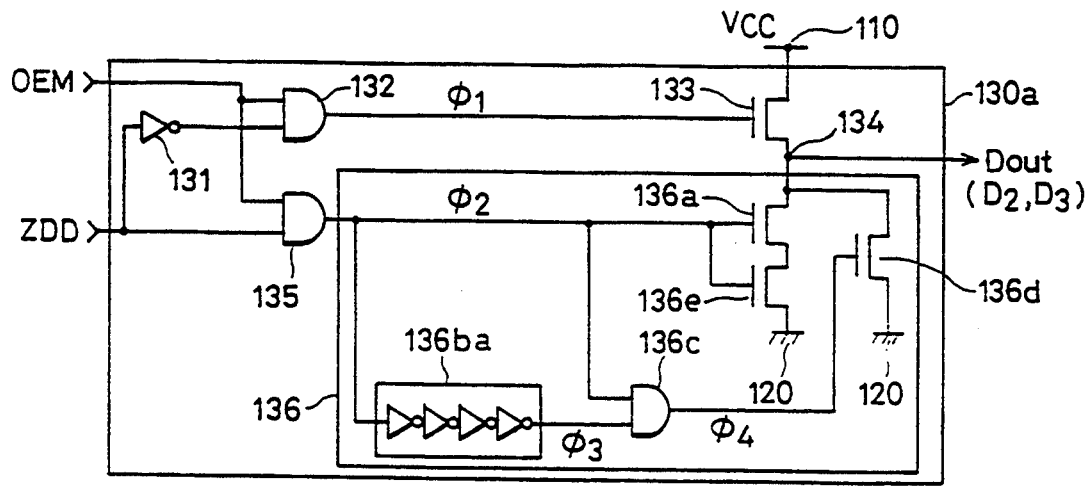
FIGS. 10A and 10B show a configuration of a data output circuit which is a fifth embodiment of the present invention.
Figure 10B:
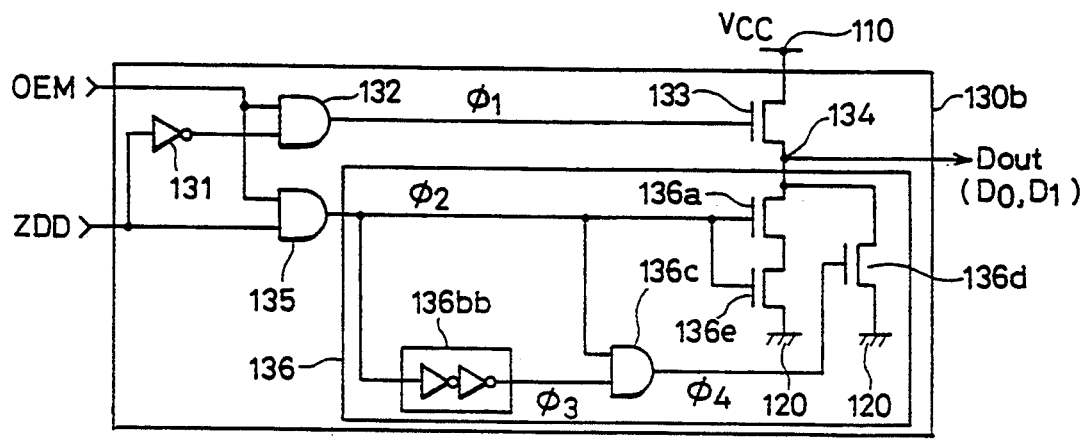

Description will be given to a semiconductor integrated circuit device according to the fifth embodiment of the present invention with reference to FIGS. 10A and 10B. FIG. 10A is a specific circuit diagram of data output circuit 130a provided at data output portions 105c and 105d proximate to ground potential pad 104, and FIG. 10B is a specific circuit diagram of data output circuit 130b provided at data output portions 105a and 105b distant from ground potential pad 104. The fifth embodiment is different from the first embodiment of the present invention shown in FIGS. 2A and 2B in that an additional n channel MOS transistor 136e is provided in series with MOS transistor 136a between output node 134 and ground potential node 120 in data output circuits 130a and 130b. MOS transistor 136e receives the output φ2 of AND circuit 135. A resistance between output node 134 and ground potential node 120 increases (on-resistances of MOS transistors 136a, 136e are connected in series), whereby discharge of output node 134 through the signal φ2 becomes slow. The discharge time (the falling time of the output data Dout) of data output circuits 130a, 130b is determined by transistor 136d, wherein the transistors 136a, 136d, 136e are preferably insulated gate type transistors.

Therefore, the same effect as in the first embodiment shown in FIGS. 2A and 2B can be obtained in the configuration shown in FIGS. 10A, 10B.

(vi) Sixth Embodiment

Figure 11A:
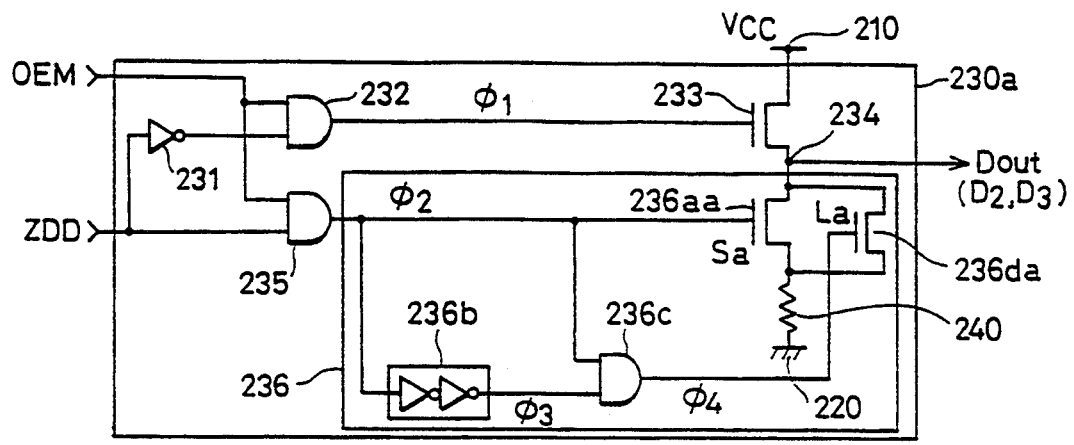
FIGS. 11A and 11B show a configuration of a data output circuit which is a sixth embodiment of the present invention.
Figure 11B:
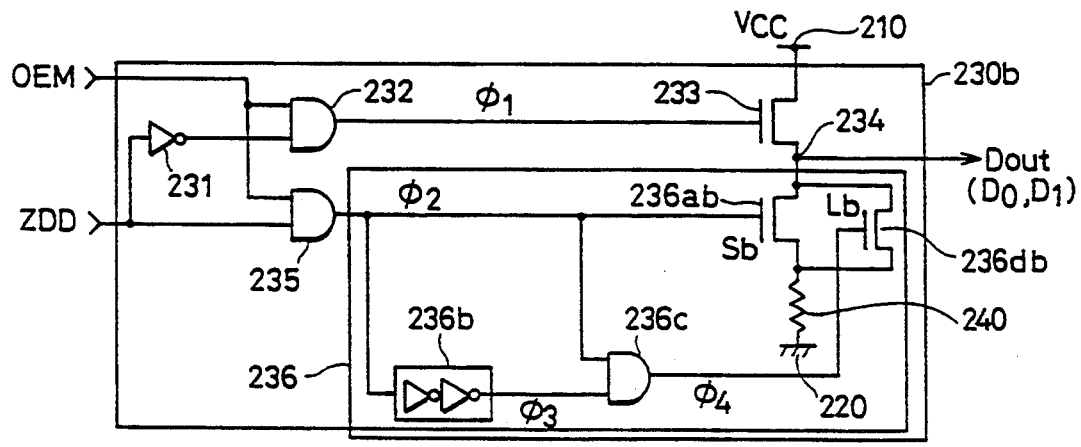

FIGS. 11A, 11B show a configuration of a data output circuit of a semiconductor memory device according to the sixth embodiment of the present invention. FIG. 11A shows a data output circuit 230a proximate to ground potential pad 104, and FIG. 11B shows a data output circuit 230b distant from ground potential pad 104.

In FIG. 11A, data output circuit 230a includes an inverter 231 receiving the data inversion signal ZDD to provide an inversion signal of the inversion signal ZDD, a 2-input AND circuit 232 receiving the output of inverter 231 and the output enable signal OEM to provide the signal φ1 which is at an "H" level when both of the two signals are at an "H" level, and which is otherwise at an "L" level, an n channel MOS transistor 233 connected between a power supply potential node 210 and an output node 234 for receiving the output signal φ1 from AND circuit 232 at the gate electrode, and a 2-input AND circuit 235 receiving the data inversion signal ZDD and the output enable signal OEM to provide the signal φ2 which is at an "H" level when both of the two signals are at an "H" level, and which is otherwise at an "L" level.

Data output circuit 230a further includes a switching circuit 236 discharging output node 234 to the potential level of ground potential node 220 in response to the output φ2 of AND circuit 235.

Switching circuit 236 includes an n channel MOS transistor 236aa connected between output node 234 and a power supply interconnection line 240 for receiving the output signal φ2 at the gate electrode, a delay circuit 236b of two inverters receiving the output signal φ2 from AND circuit 235 to provide the signal φ3 with a delay to the signal φ2, a 2-input AND circuit 236c receiving the delay signal φ3 from delay circuit 236b and the output signal φ2 from AND circuit 235 to provide the signal φ4 which is at an "H" level when both of the two signals are at an "H" level, and which is otherwise at an "L" level, and an n channel MOS transistor 236da connected between output node 234 and power supply interconnection line 240 for receiving the output signal φ4 from AND circuit 236c and having a size and a current driving ability larger than those of n channel MOS transistor 236aa. A resistance 240 shows an interconnection resistance between transistors 236aa and 236da, and ground potential node 220.

Data output circuit 230b shown in FIG. 11B has the same configuration as data output circuit 230a shown in FIG. 11A except for the following points.

By decreasing the channel width or increasing the channel length of n channel MOS transistors 236aa and 236da of data Output circuit 230a proximate to ground potential pad 104, each current driving ability (or a size) Sa, La is made smaller than a current driving ability of n channel MOS transistors 236ab and 236db of data output circuit 230b distant from ground potential pad 104, whereby a current driving ability of switching circuit 236 of data output circuit 230a is made smaller.

In the sixth embodiment of the present invention, a current driving ability of switching circuit 236 of data output circuit 230a proximate to ground potential pad 104 is small. Therefore, the output data Dout (D2, D3) falls to the ground potential as slowly as the output data Dout (D0, D1) from data output circuit 230b distant from ground potential pad 104, whereby undershoot and ringing can be prevented.

(iiv) Seventh Embodiment

Figure 12A:
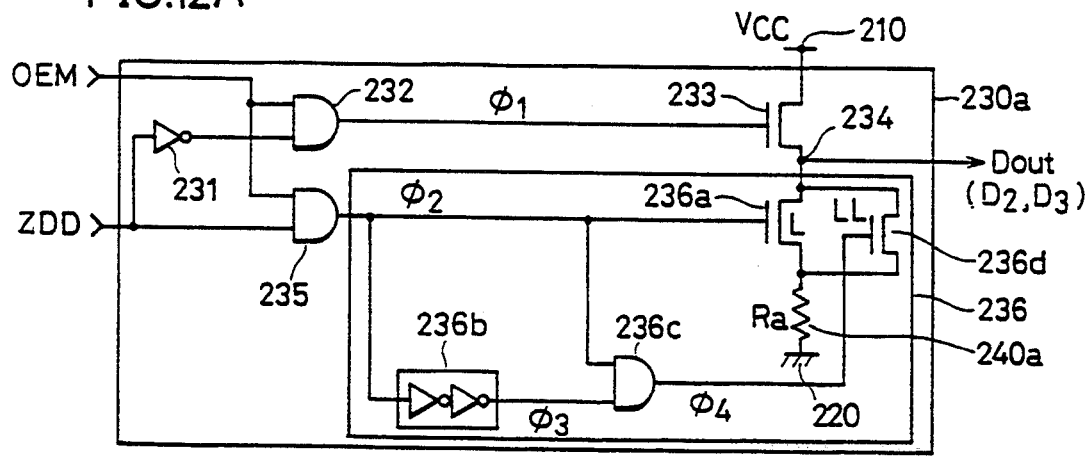
FIGS. 12A, 12B and 12C show a configuration of a data output circuit which is a seventh embodiment of the present invention.
Figure 12B:
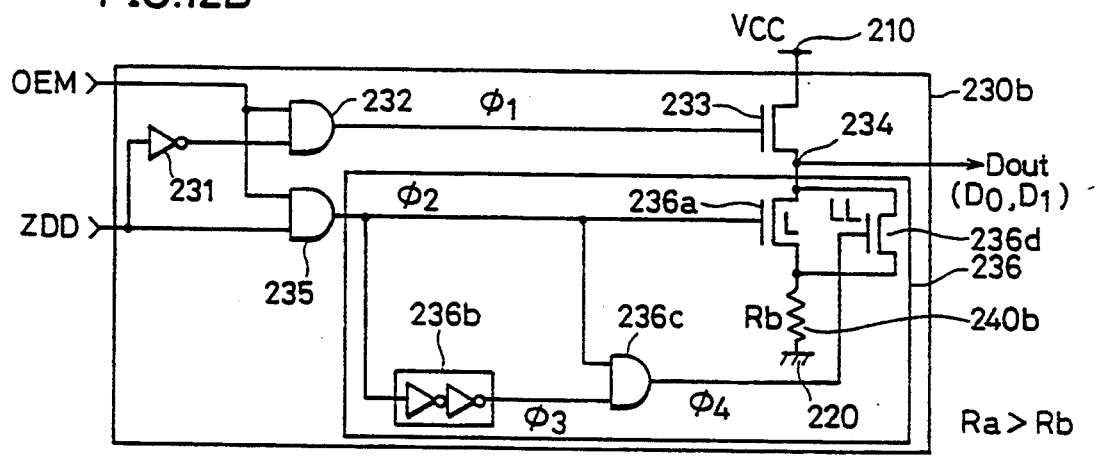

FIGS. 12A, 12B show a configuration of data output circuits 230a and 230b according to the seventh embodiment of the present invention. The configuration of data output circuits 230a, 230b is different from the configuration of the sixth embodiment in the following points. MOS transistors 236a and 236d in data output circuit 230a have the same size as transistors 236a and 236d of data output circuit 230b, respectively. A resistance value Ra of a resistance 240a in data output circuit 230a is larger than a resistance value Rb of a resistance 240b in data output circuit 230b. Resistances 240a and 240b may be formed of polysilicon or by using MOS transistors. Resistance between pad 3, and data output circuits 240a and 240b may have only to be made equal.

Figure 12C:
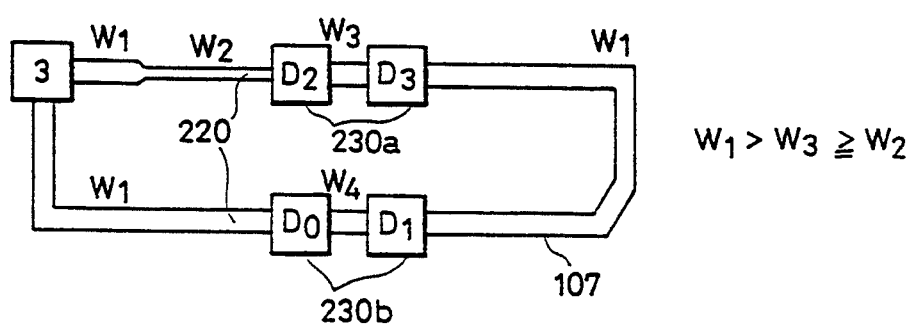

As shown in FIG. 12c, by adjusting the width and the cross-sectional area of ground potential line 107, resistances 240a, 240b may be formed equivalently. In FIG. 12C, a width W2 of ground potential line 107 to data output circuit 230a proximate to ground potential pad 3 is made smaller than a width W1 of ground potential line 107 to data output circuit 230b distant from ground potential pad 3. A width W3 of ground potential line 107 between data output circuits providing output data D0 and D1 satisfies the relation of W1<W3≧W2. A width W4 of ground potential line 107 between data output circuits providing data D0 and D1 satisfies the relation of W1≦W4.

In the seventh embodiment, resistance values between ground potential node 220 and pad 3 in data output circuits 230a and 230b become equal, and discharging is carried out slowly because of resistances 240a, 240b, whereby undershoot/ringing do not occur, and the access time is shortened.

(viii) Eighth Embodiment

Figure 13:
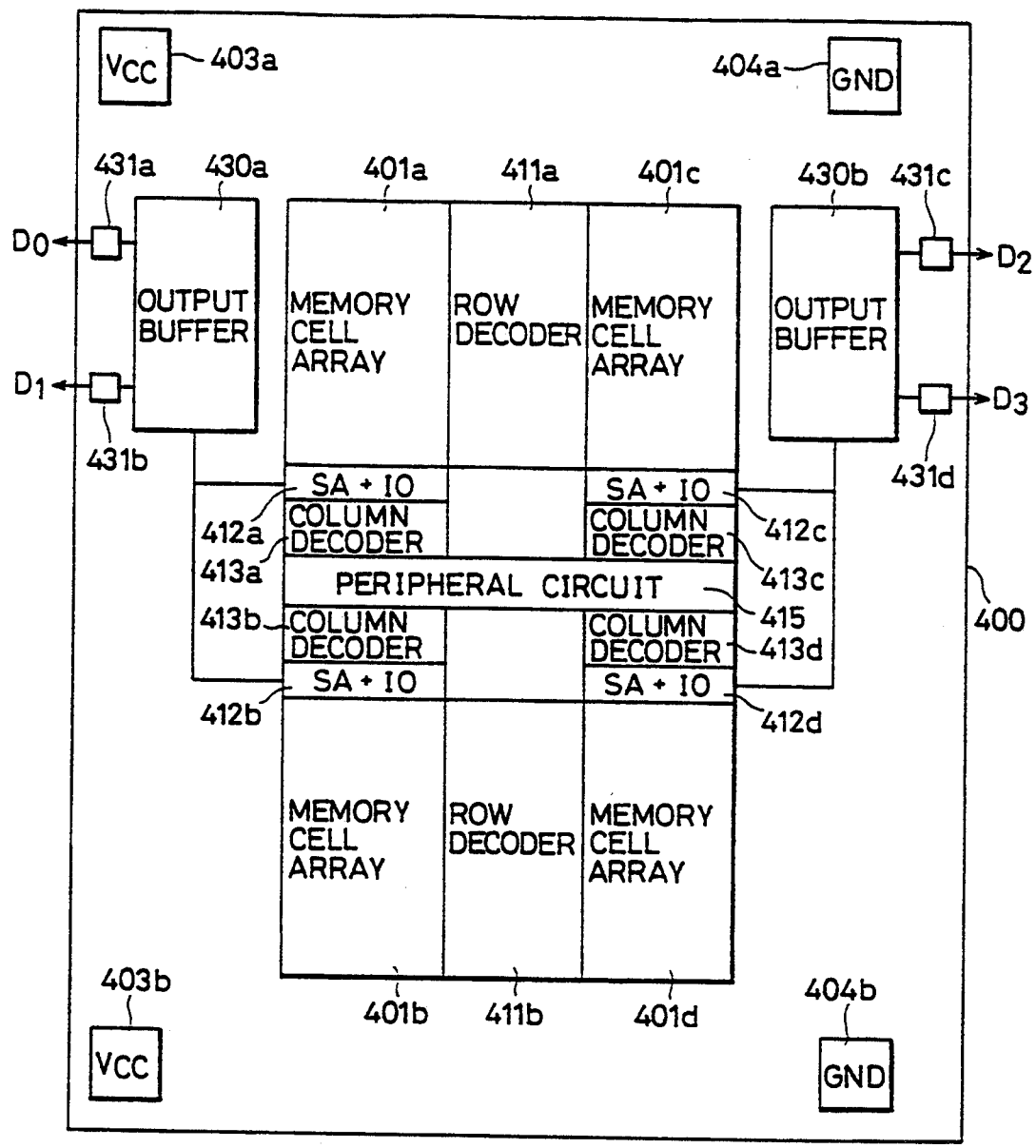
FIG. 13 shows a chip layout of a dynamic random access memory.

FIG. 13 shows a general layout of a semiconductor memory device which is, for example, by four bit DRAM.

Referring to FIG. 13, the semiconductor memory device includes four memory cell arrays (memory cell groups) 401a, 401b, 401c and 401d formed on a semiconductor chip 400, and output buffers (data output circuits) 430a, 430b providing data read from a memory cell selected from each of memory cell arrays 401a to 401d. It is shown that output buffer 430a provides data read from a memory cell selected in memory cell arrays 401a and 401b to terminals 431a and 431b, and output buffer 430b provides data read from a memory cell selected in memory cell arrays 401c and 401d to terminals 431c and 431d.

The semiconductor memory device further includes a row decoder 411a provided between memory cell arrays 401a and 401c for selecting a row (a word line) in each of arrays 401a and 401c, a row decoder 411b provided between memory cell arrays 401b and 401d for selecting a row (a word line) in each of arrays 401b and 401d, column decoders 413a, 413b, 413c and 413d provided corresponding to memory cell arrays 401a to 401d, respectively, for selecting a column (bit line pair) in a corresponding array, a sense amplifier (SA) for detecting and amplifying data of a memory cell in a selected row in memory cell arrays 401a to 401d, and an IO gate for coupling the selected column of memory cell arrays 401a to 401d to output buffers 430a, 430b. The sense amplifier and the IO gate are shown in one block 412 (412a to 412d).

A peripheral circuit 415 including a control signal generator, an address buffer and the like for controlling operations of the semiconductor memory device is disposed at the center portion of semiconductor chip 400. Pad 403 (403a, 403b) receiving the power supply potential Vcc is provided at one side end portion of semiconductor chip 400, and pad 404 (404a, 404b) receiving the ground potential GND is disposed at the other side end portion of semiconductor chip 400.

A charging/discharging rate of output buffers 430a and 430b is adjusted in the first to the seventh embodiments. It is desired that the supply potential (Vcc, GND) to output buffers 430a, 430b is made stabilized. Description will be given to a configuration for stabilizing the power supply potential/the ground potential.

(ix) Ninth Embodiment

Figure 14:
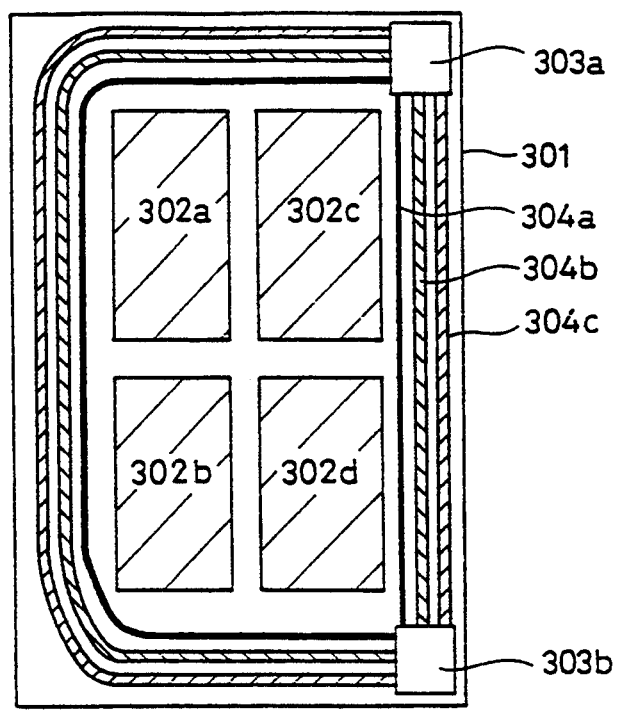
FIG. 14 shows a first configuration of a power supply interconnection line according to the present invention.

Referring to FIG. 14, the semiconductor memory device according to the ninth embodiment of the present invention includes a plurality of power supply lines 304a, 304b, and 304c. Power supply lines 304a to 304c are connected to power supply pads 303a and 303b provided at circumferential ends of semiconductor chip 301, and formed in a loop manner along the circumference of semiconductor chip 301 in parallel with each other. Power supply lines 304a to 304c may be either a Vcc line or a GND line. Memory cell groups 302a to 302d are also provided.

As shown in FIG. 13, the semiconductor memory device includes a peripheral circuit including an address buffer and a logic circuit such as a control circuit, a data output circuit and a sense amplifier group. Each circuit group has a different function, a different operation timing, and a different current consumption. Power supply lines 304a to 304c dedicated to respective circuit groups are provided. In this configuration, the number of elements connected to one power supply line is reduced to make the parasitic capacitance of the power supply line small, whereby the ground potential/the power supply potential can be supplied stably. It is because capacitive coupling with other signal lines due to the parasitic capacitance can be decreased.

Power supply lines are arranged for respective circuit groups. Therefore, even if a current flowing from the power supply potential line to the ground potential line to raise the potential of the ground potential line due to charging/discharging of the bit line caused by operations, for example, of the sense amplifier group, only the ground potential line provided with respect to the sense amplifier group is affected, and the ground potential line of the data output circuit is not affected. Therefore, it is possible to provide data stably without being affected by operations of other circuits.

Multi power supply line structure or divided supply line structure may be used independent of an adjustment of a charging/discharging rate of the data output buffer.

(x) Tenth Embodiment

Figure 15:
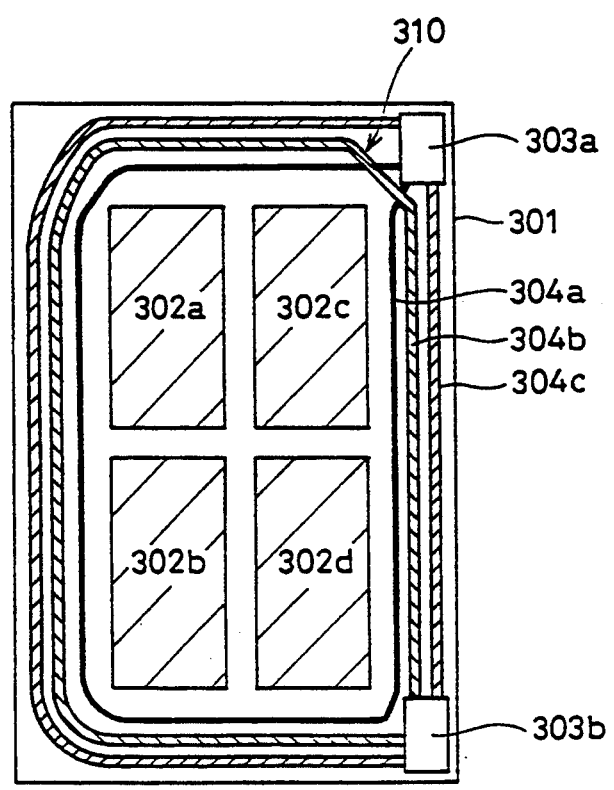
FIG. 15 shows a second configuration of the power supply interconnection line according to the present invention.

Referring to FIG. 15, the semiconductor integrated circuit device according to the tenth embodiment of the present invention includes three power supply lines 304a to 304c disposed in a loop manner along a circumference of semiconductor chip 301. Power supply line 304a is connected only to pad 303a, and power supply line 304b is connected only to pad 303b. Power supply line 304c is connected to both of pads 304a and 304b.

Pads 303a and 303b are likely to be affected by noise because of the large cross-sectional area. The peripheral circuit which is an internal logic circuit carries out a logic operation, with a relatively strong resistance to noise. Therefore, power supply line 304c with respect to the internal logic circuit system is connected to two pads 303a and 303b in order to supply the power supply potential/ground potential stably.

On the other hand, the sense amplifier group and the data output circuit have a relatively weak resistance to noise. The sense amplifier differentially amplifies the difference of potentials between bit lines. Therefore, if noise is superimposed on a sense amplifier driving signal and the power supply potential/ground potential with respect to the sense amplifier, accurate data cannot be read out because of malfunction or a long time required for amplification to a predetermined potential level.

In the data output circuit, when noise is superimposed on the power supply potential/ground potential, data on which the noise is superimposed is provided, causing an external device to carry out a faulty data reading operation.

Therefore, sense amplifier-related circuits such as a sense amplifier group, a sense amplifier driving circuit and the like and power supply lines 304a and 304b of a data output circuit are connected to only one pad. A cross-over portion 310 of power supply line 304a and power supply line 304b is in a multi-layered structure of the upper second level aluminum interconnection layer and the lower first level aluminum interconnection layer, for example.

Figure 16:
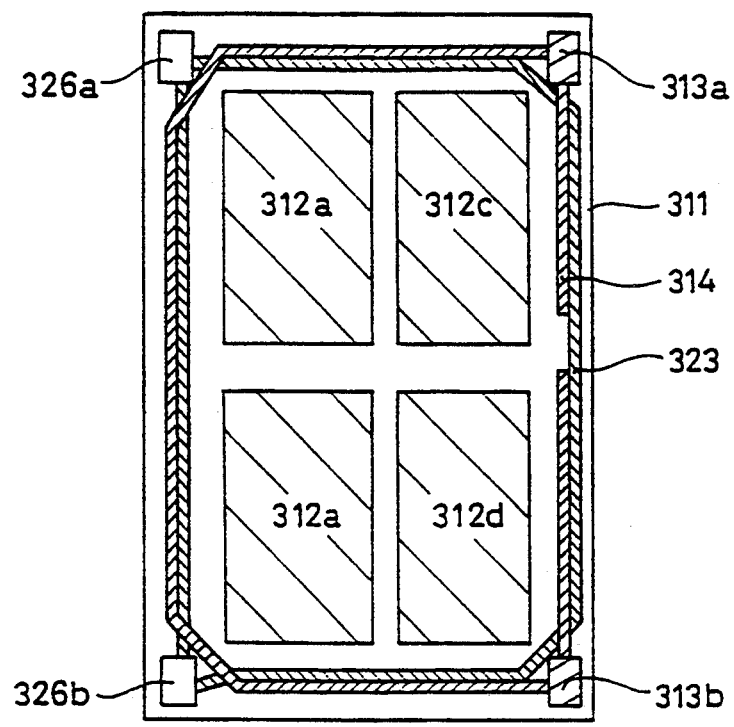
FIG. 16 shows a third configuration of the power supply interconnection line according to the present invention.

Power supply lines shown in FIGS. 15 and 16 may be formed not in a loop manner but in a meshed shape arrangement.

(xi) Eleventh Embodiment

Referring to FIG. 16, the semiconductor memory device according to the eleventh embodiment of the present invention includes a ground potential line 314 formed in a loop manner along a circumference of a semiconductor chip 311. Ground potential line 314 is connected to ground potential pads 313a and 313b with one portion forming an open loop. Power supply line 323 is connected to pads 326a and 326b, and is formed in a loop manner along a circumference of semiconductor chip 311.

Pads 326a and 326b are connected to different pin terminals. In system operation, if potentials applied to pads 326a and 326b are different, a current flows to power supply potential line 323. It is considered that the current causes a magnetic field, and that an induction current flows to ground potential line 314 because of electromagnetic induction to fluctuate the potential of ground potential line 314. In order to prevent this, a relatively wide break is provided at one portion of ground potential line 314 to decrease inductance of ground potential line 314 to reduce the amount of induction current. As a result, fluctuation of the potential of ground potential line 314 is prevented.

Figure 17:
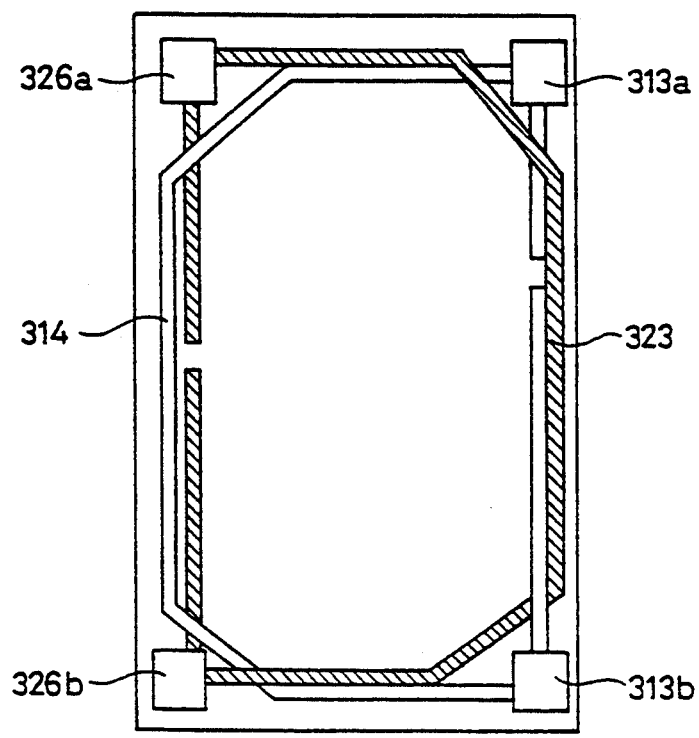
FIG. 17 shows a fourth configuration of the power supply interconnection line according to the present invention.
Figure 18:
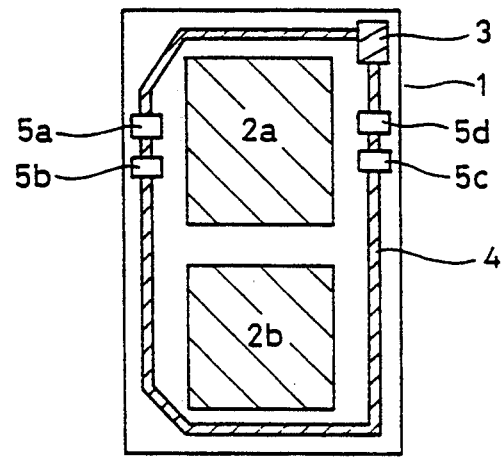
FIG. 18 shows a chip layout of a conventional semiconductor integrated circuit device.
Figure 19:
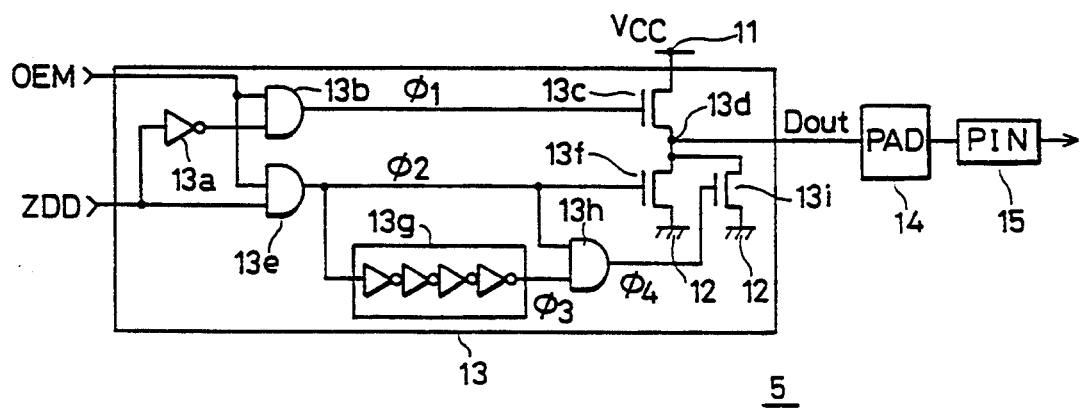
FIG. 19 shows a configuration of a data output portion serving as a starting point of the present invention.
Figure 22:
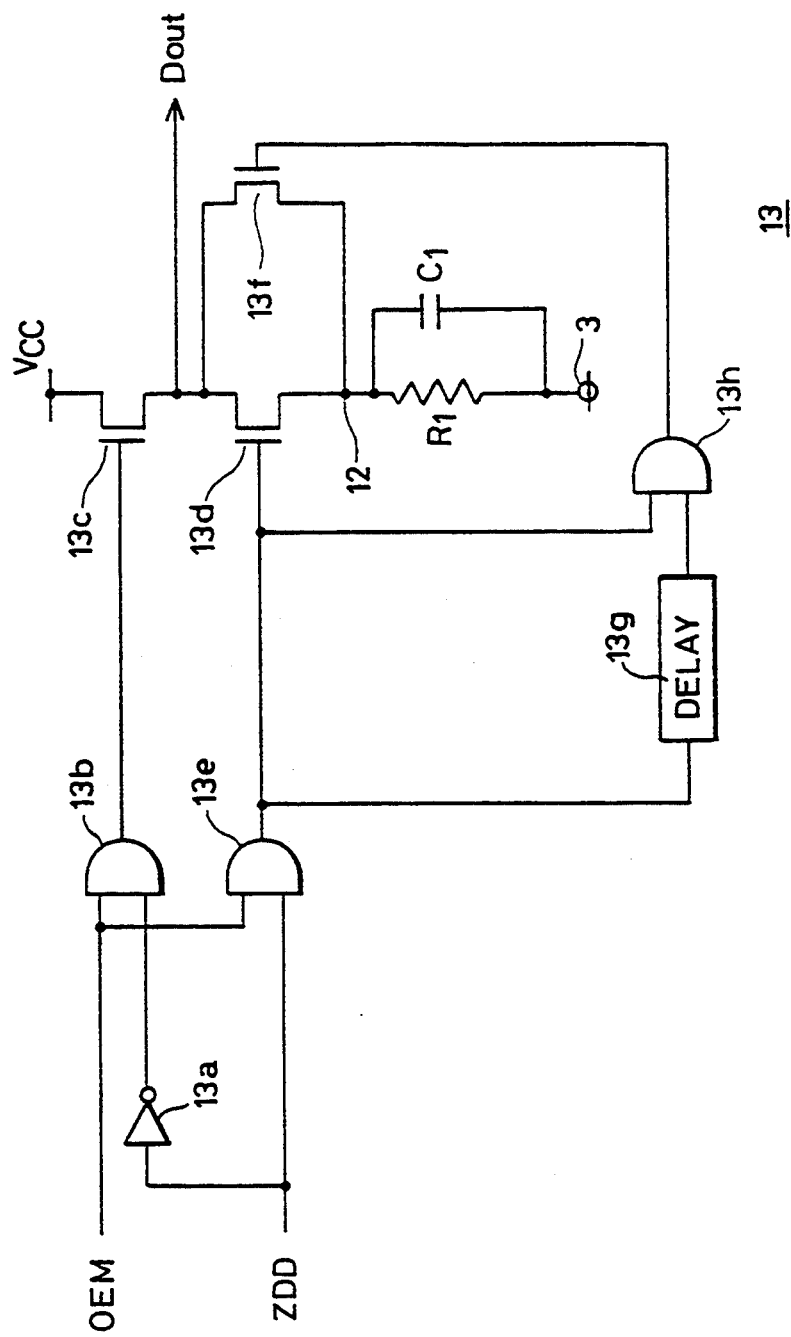
FIG. 22 is a diagram explaining problems of the circuit shown in FIG. 19.
Figure 23:
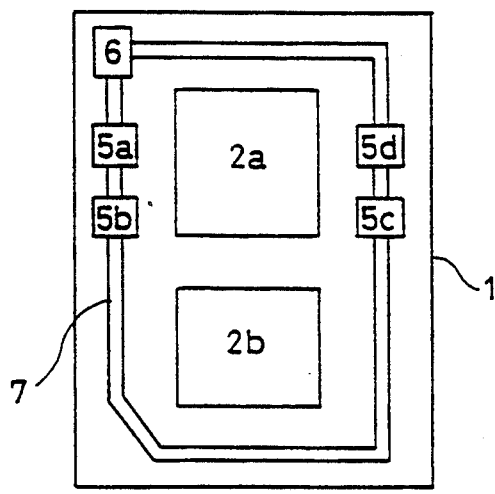
FIG. 23 shows an arrangement of a power supply potential line of the conventional semiconductor integrated circuit device.
Figure 24:
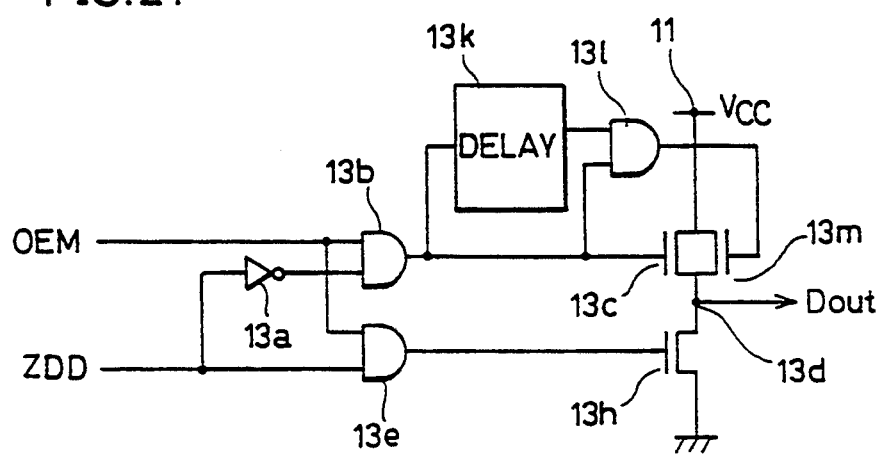
FIG. 24 shows a configuration of a data output circuit improved by the present invention.
Figure 25:
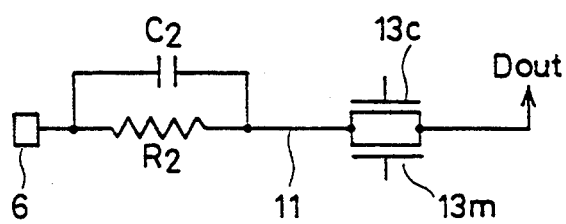
FIG. 25 is a diagram for explaining problems of the data output circuit shown in FIG. 24.

As shown in FIG. 17, power supply potential line 323 and ground potential line 314 may be formed in an open loop manner having a break at one portion.

Although various embodiments of the present invention have been described above, the number of the power supply potential pads and the number of ground potential pads may be more than two. In the case of the semiconductor memory device, the number of data output terminals is not limited to four. The number of data output terminals may be 8, 16 or the like.

The main effects of the present invention are as follows.

A time required for providing a predetermined potential of a data output circuit distant from the pad to which the predetermined potential is applied is short.

Undershoot and ringing can be prevented which occur when the data output circuit proximate to the pad to which the predetermined potential is applied provides the predetermined potential.

A stable predetermined potential can be supplied.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor integrated circuit device formed on a chip, comprising:

a pad formed on said chip for receiving a predetermined potential;

a conductor line connected to said pad for transmitting said predetermined potential;

first output means receiving said predetermined potential through said conductor line and responsive to a received first data signal for generating an output signal of said predetermined potential level onto a first output node; and second output means receiving said predetermined potential through said conductor line and responsive to a received second data signal for generating an output signal of said predetermined potential level onto a second output node;

a distance between said second output means and said pad along said conductor line being greater than a distance between said first output means and said pad;

said second output means including adjust means for increasing a rate of driving said second output node as compared to said first output means.

2. A semiconductor integrated circuit device according to claim 1, wherein said first output means includes first switching means for driving said first output node to said predetermined potential level, and first drive means responsive to said first data signal for activating said first switching means at a first timing, and said second output means includes second switching means for driving said second output node to said predetermined potential level, and second drive means responsive to said second data signal for activating said second switching means at a second timing earlier than said first timing.

3. A semiconductor integrated circuit device according to claim 2, wherein said first drive means includes first delay means for delaying said first data signal by a first delay time, and said second drive means includes second delay means for delaying said second data signal by a second delay time shorter than said first delay time.

4. A semiconductor integrated circuit device according to claim 1, wherein said first output means includes first switching means for driving said first output node to said predetermined potential level at a first rate, second switching means for driving said first output node to said predetermined potential level at a second rate faster than said first rate, first drive means responsive to said first data signal for activating said first switching means, and second drive means responsive to said first data signal for activating said first switching means at a first timing and for activating said second switching means at a second timing later than said first timing, and said second output means includes third switching means for driving said second output node at said first rate, fourth switching means for driving said second output node at said second rate, third drive means responsive to said second data signal for activating said third switching means, and fourth drive means responsive to said second data signal for activating said third switching means at a third timing earlier than said first timing and for activating said fourth switching means at a fourth timing later than said third timing and earlier than said second timing.

5. A semiconductor integrated circuit device according to claim 1, wherein said first output means includes:

first switching means for driving said first output node to said predetermined potential level at a first rate, second switching means responsive to said first data signal for driving said first output node to said predetermined potential level at a second rate faster than said first rate, first resistance means connected between said first switching means and a node coupled to said conductor line, first drive means responsive to said first data signal for activating said first switching means, and second drive means responsive to said first data signal for activating said second switching means at a first timing later than the activation of said first switching means, and said second output means includes:

third switching means for driving said second output node to said predetermined potential level at the first rate, fourth switching means for driving said second output node to said predetermined potential level at the second rate, third drive means responsive to said second data signal for activating said third switching means, fourth drive means responsive to said second data signal for activating said fourth switching means at a second timing later than said first timing, and second resistance means connected between said third switching means and a node connected to said conductor line.

6. A semiconductor integrated circuit device according to claim 5, wherein said first and third switching means each comprises an insulated gate type transistor, said first resistance means comprises an insulated gate type transistor responsive to an output of said first drive means, and said second resistance means comprises an insulated gate type transistor responsive to an output of said third drive means.

7. A semiconductor integrated circuit device according to claim 1, wherein said first output means includes first switching means for driving said first output node with a first current driving ability, and first drive means responsive to said first data signal for activating said first switching means, and said second output means includes second switching means for driving said second output node to said predetermined potential level with a second current driving ability greater than said first current driving ability, and second drive means responsive to said second data signal for activating said second switching means.

8. A semiconductor integrated circuit device according to claim 7, wherein said first switching means comprises an insulated gate type transistor having a first size, and said second switching means comprises an insulated gate type transistor having a second size larger than said first size.

9. A semiconductor integrated circuit device according to claim 1, wherein said first output means includes first switching means responsive to said first data signal for driving said first output node to said predetermined potential level, and first resistance means connected between said first switching means and a node connected to said conductor line and having a first resistance value (Ra), and said second output means includes second switching means responsive to said second data signal for driving said second output node to said predetermined potential level, and second resistance means connected between said second switching means and a node connected to said conductor line and having a second resistance value (Rb) smaller than said first resistance value.

10. A semiconductor integrated circuit device according to claim 1, wherein said conductor line includes a first portion having a first resistivity per unit length and coupled to said first output means, and a second portion having a second resistivity per unit length and coupled to said second output means, said second resistivity being smaller than said first resistivity.

11. A semiconductor integrated circuit device according to claim 1, wherein
said conductor line includes a plurality of interconnection lines provided in parallel, and an interconnection line is exclusively employed for said first and second output means.

12. A semiconductor integrated circuit device according to claim 1, wherein
said pad includes a first pad and a second pad, and said conductor line is connected to only one of said first and second pads.

13. A semiconductor integrated circuit device according to claim 1, wherein
said conductor line is formed along periphery of said chip to form an open loop with a portion open-circuited.

14. A semiconductor integrated circuit device according to claim 1, further comprising
a memory cell array having a plurality of memory cells, and wherein said first and second output means are enabled by an output enable signal and receive data read from memory cells selected in said memory cell array as said first and second data signals to generate said output signals in parallel.

15. A semiconductor integrated circuit device, comprising:
a pad provided on a semiconductor chip for receiving an externally applied predetermined potential;
first data output means receiving said predetermined potential from said pad through a power supply line for providing said predetermined potential to a data pin corresponding to a level of data received from an interior of the semiconductor chip, said first data output means including switching means connected between the data pin provided on said semiconductor chip and said power supply line whose current driving ability is enhanced after a predetermined time since conduction thereof; and
second data output means provided more distant from said pad than said first data output means on said semiconductor chip, receiving said predetermined potential from said pad through the power supply line, for providing said predetermined potential to the data pin corresponding to a level of data received from an interior of the semiconductor chip, said second output means including switching means connected between said data pin and said power supply line whose current driving ability is enhanced after a time shorter than said predetermined time after conduction thereof.

16. A semiconductor integrated circuit device, comprising:
a pad provided on a semiconductor chip for receiving an externally applied predetermined potential;
first data output means receiving said predetermined potential from said pad through a power supply interconnection line for providing said predetermined potential to a data pin corresponding to a level of data received from an interior of the semiconductor chip, and including switching means connected between the data pin provided on said semiconductor chip and said power supply interconnection line; and
second data output means provided in a position more distant from said pad than said first data output means in said semiconductor chip, receiving said predetermined potential from said pad through the power supply interconnection line, for providing said predetermined potential to the data pin corresponding to a level of data received from an interior of the semiconductor chip, said second output means including switching means having a current driving ability larger than the switching means in said first output means for providing said predetermined potantial.

17. A semiconductor integrated circuit device, comprising:
a pad provided in a semiconductor chip for receiving an externally applied predetermined potential;
first data output means receiving said predetermined potential from said pad through a power supply interconnection line for providing said predetermined potential to a data pin corresponding to a level of data received from an interior of said semiconductor chip, said first output means including switching means connected between the data pin provided in said semiconductor chip and said power supply interconnection line; and
second data output means provided in a position more proximate to said pad than said first data output means on said semiconductor chip, receiving said predetermined potential through the power supply interconnection line having a resistance per unit length higher than that of said power supply interconnection line from the pad, for providing said predetermined potential to the data pin corresponding to a level of data received from an interior of said semiconductor chip, said second output means including switching means connected between the data pin provided in the semiconductor chip and said power supply interconnection line.

* * * * *